US012690482B2

(12) United States Patent
Baek et al.

(10) Patent No.: US 12,690,482 B2
(45) Date of Patent: Jul. 21, 2026

(54) SUBSTRATE BONDING APPARATUS

(71) Applicant: Samsung Electronics Co., Ltd.,
Suwon-si (KR)

(72) Inventors: In Hwa Baek, Suwon-si (KR); Se Hyun Lee, Cheonan-si (KR); Su Chul Park, Cheonan-si (KR); Kyung Su Yoon, Cheonan-si (KR); Young Ho Kim, Suwon-si (KR); Ho Kim, Suwon-si (KR)

(73) Assignees: Samsung Electronics Co., Ltd, Suwon-si (KR); SEMES CO., LTD., Cheonan-si (KR)

( * ) Notice: Subject to any disclaimer, the term of this patent is extended or adjusted under 35 U.S.C. 154(b) by 0 days.

(21) Appl. No.: 18/940,190

(22) Filed: Nov. 7, 2024

(65) Prior Publication Data

US 2025/0357423 A1 Nov. 20, 2025

(30) Foreign Application Priority Data

May 20, 2024 (KR) ........................ 10-2024-0065118

(51) Int. Cl.
*B23K 37/04* (2006.01)
*B23K 3/08* (2006.01)
(Continued)

(52) U.S. Cl.
CPC ......... *H10W 72/0198* (2026.01); *B23K 3/087* (2013.01); *B23K 37/0408* (2013.01);
(Continued)

(58) Field of Classification Search
CPC ......... H01L 24/94; H01L 24/74; H01L 24/80; H01L 2224/74; H01L 2224/80093; H01L 2224/80365; H01L 2224/80908; H01L 2224/94; H01L 2924/37001; B23K 1/00–206; B23K 3/00–087; B23K 2101/36–42; B23K 37/04–0461
(Continued)

(56) References Cited

U.S. PATENT DOCUMENTS 9,015,930 B2 * 4/2015 Maeda .............. H01L 21/67092
29/830
2003/0226253 A1 * 12/2003 Mayer .................... B23K 3/087
257/E23.087
(Continued)

FOREIGN PATENT DOCUMENTS

CN 105655282 A * 6/2016 ....... H01L 21/68778
CN 118053802 A * 5/2024 ............. H01L 24/80
(Continued)

*Primary Examiner* — Kiley S Stoner
(74) *Attorney, Agent, or Firm* — Wolf, Greenfield & Sacks, P.C.

(57) ABSTRACT

A substrate bonding apparatus of the present disclosure includes a first chuck having a diameter larger than that of a first substrate; a deformation plate configured to support the first substrate, and is configured to have a variable shape on the first chuck; and a deformation unit between the first chuck and the deformation plate, wherein the deformation unit includes a main supporter that is deformable to press the deformation plate, the main supporter having a closed curve shape with a penetrating center.

19 Claims, 21 Drawing Sheets

(51) Int. Cl.

| | |
|---|---|
| *H10W 72/00* | (2026.01) |
| *H10W 99/00* | (2026.01) |
| *H10W 72/90* | (2026.01) |
| *H10W 80/00* | (2026.01) |

(52) U.S. Cl.
CPC .......... *H10W 72/011* (2026.01); *H10W 99/00* (2026.01); *H10W 72/071* (2026.01); *H10W 72/931* (2026.01); *H10W 80/102* (2026.01); *H10W 80/301* (2026.01)

(58) Field of Classification Search
USPC ......... 228/47.1–49.5, 179.1–180.22, 6.1–6.2
See application file for complete search history.

(56) References Cited

U.S. PATENT DOCUMENTS

| | | | |
|---|---|---|---|
| 2016/0009070 A1* | 1/2016 | Hayashi | B23K 20/233 |
| | | | 156/367 |
| 2017/0221856 A1* | 8/2017 | Yamauchi | H01L 24/94 |
| 2018/0122845 A1* | 5/2018 | Kim | H10F 39/026 |
| 2018/0144999 A1* | 5/2018 | Lu | H01L 24/94 |
| 2018/0370210 A1* | 12/2018 | Kim | H01L 24/08 |
| 2019/0067217 A1* | 2/2019 | England | H01L 24/94 |
| 2019/0148333 A1* | 5/2019 | Chen | H01L 24/94 |
| | | | 438/16 |
| 2019/0267347 A1* | 8/2019 | Yu | H01L 24/83 |
| 2020/0043884 A1* | 2/2020 | Lee | H01J 37/32899 |
| 2020/0075360 A1* | 3/2020 | Kim | H01L 21/68735 |
| 2020/0152596 A1* | 5/2020 | Kim | H01L 21/67092 |
| 2020/0273835 A1* | 8/2020 | Inamasu | H01L 21/67259 |
| 2020/0373274 A1* | 11/2020 | Han | H01L 21/67092 |
| 2021/0005475 A1* | 1/2021 | Lim | H01L 21/6838 |
| 2021/0050243 A1* | 2/2021 | Otsuka | H01L 21/67259 |
| 2021/0057263 A1* | 2/2021 | Kim | H01L 24/74 |
| 2021/0143026 A1* | 5/2021 | Jeon | B32B 41/00 |
| 2022/0230895 A1* | 7/2022 | Gregory | H01L 21/67092 |
| 2023/0019415 A1* | 1/2023 | Chen | H01L 21/681 |
| 2023/0207514 A1* | 6/2023 | Gao | H01L 24/74 |
| | | | 438/107 |
| 2023/0378125 A1* | 11/2023 | Yu | H01L 21/67092 |
| 2024/0242981 A1* | 7/2024 | Jang | H01L 21/67092 |
| 2024/0371705 A1* | 11/2024 | Hung | H01L 21/6838 |
| 2025/0174595 A1* | 5/2025 | Kuo | H01L 21/68742 |
| 2025/0219011 A1* | 7/2025 | Baek | H01L 24/74 |
| 2025/0308978 A1* | 10/2025 | Hong | H01L 24/74 |

FOREIGN PATENT DOCUMENTS

| | | | | | |
|---|---|---|---|---|---|
| EP | 4084050 | A1 * | 11/2022 | ....... | H01L 21/67092 |
| KR | 100186517 | B1 * | 4/1999 | ............ | H01L 21/60 |
| KR | 20120076689 | A | 7/2012 | | |
| KR | 20160148477 | A | 12/2016 | | |
| KR | 20200005333 | A | 1/2020 | | |
| KR | 20200019391 | A | 2/2020 | | |
| KR | 20200133634 | A | 11/2020 | | |
| KR | 20210003461 | A | 1/2021 | | |
| KR | 20210023298 | A | 3/2021 | | |
| KR | 102435062 | B1 * | 8/2022 | ....... | H01L 21/67144 |
| KR | 20230136681 | A * | 9/2023 | ........... | H01L 21/187 |
| KR | 20240115037 | A * | 7/2024 | ........... | H01L 21/185 |
| TW | 202418359 | A * | 5/2024 | ......... | H01L 21/6835 |
| WO | WO-2012121046 | A1 * | 9/2012 | ........... | B23K 20/233 |
| WO | WO-2016104710 | A1 * | 6/2016 | ............ | B23K 3/085 |
| WO | WO-2017168531 | A1 * | 10/2017 | ............ | H01L 24/80 |
| WO | WO-2017168534 | A1 * | 10/2017 | ......... | H01L 21/2007 |
| WO | WO-2022158563 | A1 * | 7/2022 | ........... | H01L 21/187 |
| WO | WO-2023122687 | A1 * | 6/2023 | ....... | H01L 21/67144 |

\* cited by examiner

SUBSTRATE BONDING APPARATUS

CROSS-REFERENCE TO RELATED APPLICATION

This application claims priority under 35 U.S.C. 119 from Korean Patent Application No. 10-2024-0065118, filed on 20 May 2024 in the Korean Intellectual Property Office, the disclosure of which is herein incorporated by reference in its entirety.

BACKGROUND

The present disclosure relates to a substrate bonding apparatus.

In the related art, a main concern in semiconductor technique was to increase the degree of integration. However, as an improvement in degree of integration of semiconductor elements reaches its limit, a 3D packaging technique that stacks the semiconductor elements three-dimensionally has come into the spotlight. When utilizing a stacking method in a vertical direction, because more elements may be implemented in the same silicon area, there are advantages of being able to lower manufacturing costs and improve performance.

There are several methods for generating 3D IC, and representatively, there are "Chip-to-Chip (C2C) Bonding", "Wafer-to-Wafer (W2W) Bonding", and "Chip-to-Wafer (C2W) Bonding". The C2C and C2W are methods of cutting them into chip units and bonding the chips together or bonding the cut chip to a substrate (wafer), but have disadvantages of taking a long process time and increasing manufacturing costs.

The W2W refers to a process of aligning two or more substrates, then bringing them into contact with and bonding each other. The W2W is a method of bonding the substrates together and cutting them into chip units at once, and has advantages of a short manufacturing process time and high productivity.

However, when two substrates are bonded in a flat status at the time of bonding for the wafer-to-wafer bonding method, air bubbles may be formed between the two substrates, the air bubbles cause chip short-circuiting problems, resulting in problems such as a decrease in chip yield or provision of further process.

To solve the above problem, a method of providing a lower substrate of the two hydrophilically treated substrates into a convexly hemispherical shape, then first bonding an upper substrate to the lower substrate by a point contact, and then bonding the substrates toward a substrate edge is used.

In such a bonding method, in the process of deforming the substrate into a convexly hemispherical shape, insufficient expansion and excessive expansion may occur adjacent to an edge region compared to a center part, resulting in a problem such as a decrease in chip yield. Accordingly, efforts to improve this problem are required.

SUMMARY

Aspects of the present disclosure provide a substrate bonding apparatus that may improve a chip yield.

However, aspects of the present disclosure are not restricted thereto. The above and other aspects of the present disclosure will become more apparent to one of ordinary skill in the art to which the present disclosure pertains by referencing the detailed description below.

An aspect of the substrate bonding apparatus of the present disclosure includes a first chuck having a diameter larger than that of a first substrate; a deformation plate configured to support the first substrate, and is configured to have a variable shape on the first chuck; and a deformation unit between the first chuck and the deformation plate, wherein the deformation unit includes a main supporter that is deformable to press the deformation plate, the main supporter having a closed curve shape with a penetrating center.

An aspect of the substrate bonding apparatus of the present disclosure includes a lower module; and an upper module provided with a second chuck that supports a second substrate opposite to the first substrate.

Another aspect of the substrate bonding apparatus of the present disclosure includes a lower module including a first chuck having a diameter larger than that of a first substrate; and an upper module including a second chuck configured to support a second substrate opposite to the first substrate, wherein the lower module includes a deformation plate configured to support the first substrate, the deformation plate above the first chuck and configured to have a variable shape, a thickness of an edge region of the deformation plate being thinner than a thickness of a center part or a middle region of the deformation plate, a lower face of the edge region including an inclined face that is inclined upward relative to horizontal; a deformation unit between the first chuck and the deformation plate; a clamp unit configured to restrain the deformation plate to prevent the deformation plate from being detached from the first chuck; a cylindrical first rib with an open top at the center part of the deformation unit; a first sensor at the center part of the deformation unit and the first rib; and a first target at the center part on the lower face of the deformation plate and defining a sensing face of the first sensor, wherein the deformation unit includes: a main supporter having a ring shape and having an expandable volume in response to fluid supplied from a first fluid regulator to press the deformation plate; and an auxiliary support unit positioned outside the main supporter, the auxiliary support unit having a volume that varies due to inflow and outflow of fluid supplied from a compressor, which presses the deformation plate in an upward direction by provision of a positive pressure, or which pulls the deformation plate in a downward direction by provision of a negative pressure by a vacuum pump, wherein the clamp unit includes: a first ring below the first chuck; a second ring above the deformation plate; and a bolt which is coupled to the first ring and the second ring, and passes through the deformation plate and the first chuck without being bolted to the deformation plate and the first chuck.

Specific features or matters of other embodiments are included in the detailed description and drawings.

The substrate bonding apparatus according to the present disclosure can improve an accuracy limit and precisely adjust an alignment accuracy to improve the chip yield.

BRIEF DESCRIPTION OF THE DRAWINGS

The above and other aspects and features of the present disclosure will become more apparent by explaining in detail example embodiments thereof with reference to the attached drawings, in which:

Figure 25:
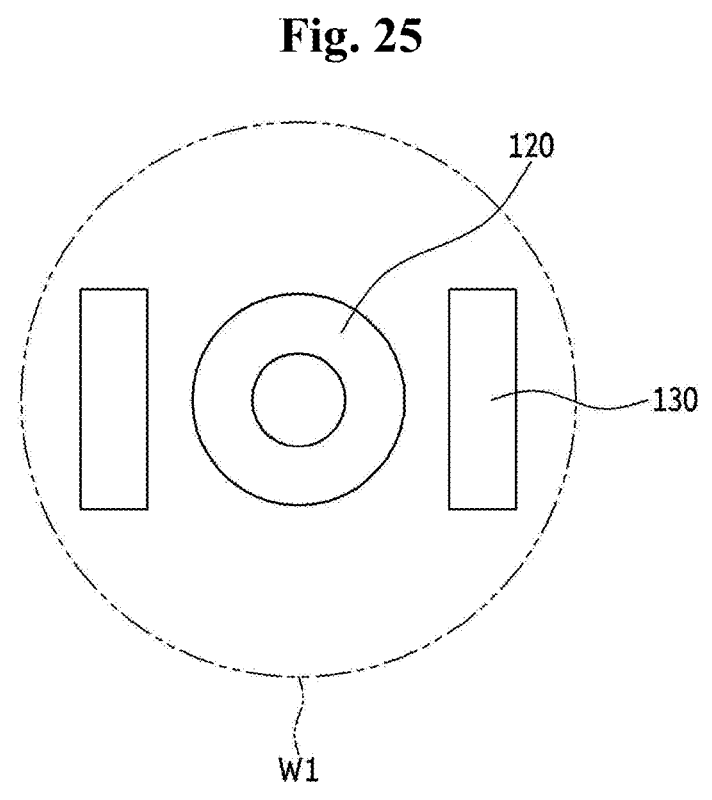

FIG. 25 is a plan view showing a lower module according to some embodiments of the present disclosure;

FIG. 28 is a diagram showing a lower module according to some embodiments of the present disclosure.

DETAILED DESCRIPTION

Figure 1:
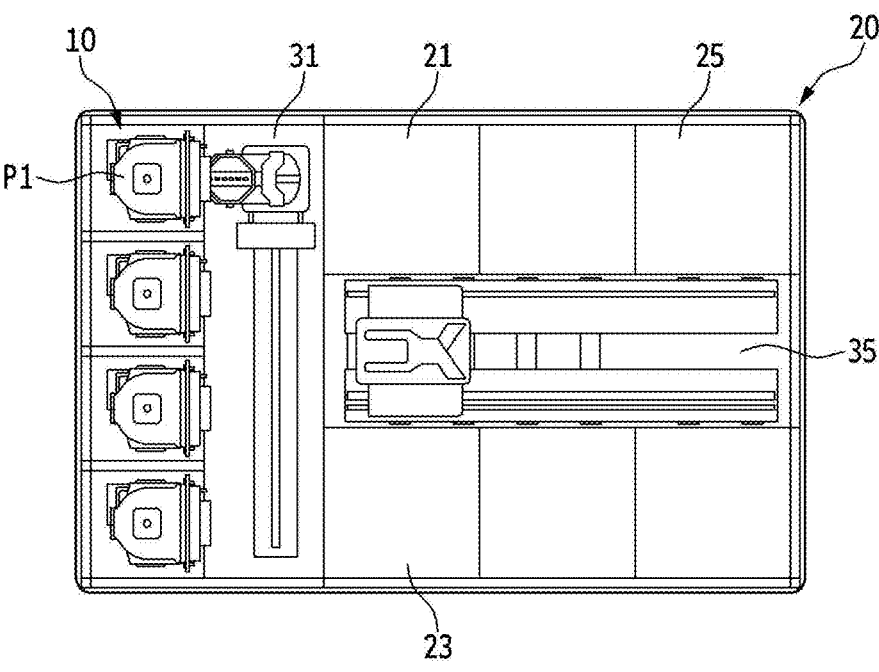
FIG. 1 is a plan view for explaining a substrate processing system according to some embodiments of the present disclosure.

Hereinafter, example embodiments of the present disclosure will be described in detail with reference to the accompanying drawings. Advantages and features of the present disclosure, and methods for achieving the same will become apparent by reference to the following embodiments described in detail with the accompanying drawings. However, the present disclosure is not limited to the embodiments described below, and may be embodied in various different forms. The present embodiments are merely provided to make the disclosure clear and enabling, and to thoroughly notify category or categories of the present disclosure to one of ordinary skill in the art to which the present disclosure pertains, and the present disclosure is only defined by the claims. The same reference numerals refer to the same components throughout the specification.

Terms used in this specification are for the purpose of explaining the embodiments, and are not intended to limit the present disclosure. In this specification, the singular forms also include the plural forms unless they are particularly mentioned in the context. As for terms such as "comprises" and/or "comprising" used in this specification, the referenced components, steps, operations and/or elements do not exclude presence or addition of one or more other components, steps, operations and/or elements.

FIG. 1 is a plan view for explaining a substrate processing system according to some embodiments of the present disclosure.

Referring to FIG. 1, a substrate processing system 1 according to some embodiments of the present disclosure may be made up of a room having an internal space, and may include an index module 10 and a process module 20.

The index module 10 is provided with substrates W1 and W2 (see FIG. 2) from the outside, and may transport the substrates W1 and W2 to the process module 20. The index module 10 may be an equipment front end module equipped with a load port.

A container P1 containing the substrates W1 and W2 may be placed on the load port. A front opening unified pod (FOUP) may be used as the container P1. The container P1 may be carried into the load port from the outside by an overhead transfer (OHT), and may be carried out from the load port to the outside.

A first transport module 31 may be disposed between the index module 10 and the process module 20. The first transport module 31 may convey the substrates W1 and W2 between the container P1 placed on the load port and the process module 20. The first transport module 31 may include an index robot that moves on an index rail.

The process module 20 may include a plurality of process chambers 21, 23, and 25. A second transport module 35 may be disposed between the plurality of process chambers 21, 23, and 25. A transport robot of the second transport module 35 may transport the substrates W1 and W2 to a predetermined process chamber 21, 23, or 25 among the plurality of process chambers 21, 23, and 25. As an example, the substrates W1 and W2 may be delivered from any one process chamber (e.g., 23) among the plurality of process chambers 21, 23, and 25 to another process chamber (e.g., 25).

The plurality of process chambers 21, 23, and 25 may be disposed in a line, may be disposed to be stacked up and down, or may be disposed in a combined form thereof. As shown in FIG. 1, some process chambers 23 different from some process chambers 21 and 25 may be disposed on both sides of the second transport module 35. The placement of the plurality of process chambers 21, 23, and 25 is not limited to the aforementioned example, and may be changed in consideration of the footprint and process efficiency of the substrate processing system 1.

The plurality of process chambers 21, 23 and 25 may include a plasma processing apparatus 21, a cleaning apparatus 23, and a substrate bonding apparatus 25.

The plasma processing apparatus 21 may perform plasma processing on at least one of the surfaces of the two substrates W1 and W2. That is, the plasma processing apparatus 21 may be provided as a processing apparatus for making at least one of the bonding surfaces of the first substrate W1 and the second substrate W2 hydrophilic by the plasma processing.

The plasma processing apparatus 21 may irradiate plasma onto the surfaces of the substrates W1 and W2 disposed in an inductively coupled plasma (ICP) chamber to form dangling bonds (or hybrid bonds) on the surfaces of the substrates W1 and W2. However, the plasma generated by the plasma processing apparatus 21 is not limited to inductively coupled plasma, and may be, for example, capacitively coupled plasma, microwave plasma or the like.

The cleaning apparatus 23 may clean the surfaces of the substrates W1 and W2 that is subjected to plasma-processing by the plasma processing apparatus 21. The cleaning apparatus 23 may coat the surfaces of the substrates W1 and W2 with deionized water (DIW) using a spin coater. The DIW not only cleans the surfaces of the substrates W1 and W2, but also allows hydroxyl (—OH) groups to be well bonded to the surfaces of the substrates W1 and W2, thereby making it easier to form dangling bonds on the surfaces of the substrates W1 and W2.

The substrate bonding apparatus 25 may perform bonding in a wafer-to-wafer method of directly bonding the two substrates W1 and W2 that are subjected to plasma-processing in the plasma treatment apparatus 21 and cleaned in the cleaning apparatus 23 without a separate medium. That is, the substrate bonding apparatus 25 may bond the two substrates W1 and W2 without using a bonding medium such as an adhesion film and a solder bump.

The substrate bonding apparatus 25 may include a number of chucks (first chuck 110 and second chuck 210) that support the two substrates W1 and W2, and a component (e.g., top pusher 220) that presses the substrates W1 and W2 to perform the wafer-to-wafer method.

The substrate bonding apparatus 25 will be described below with reference to the drawings.

Figure 2:
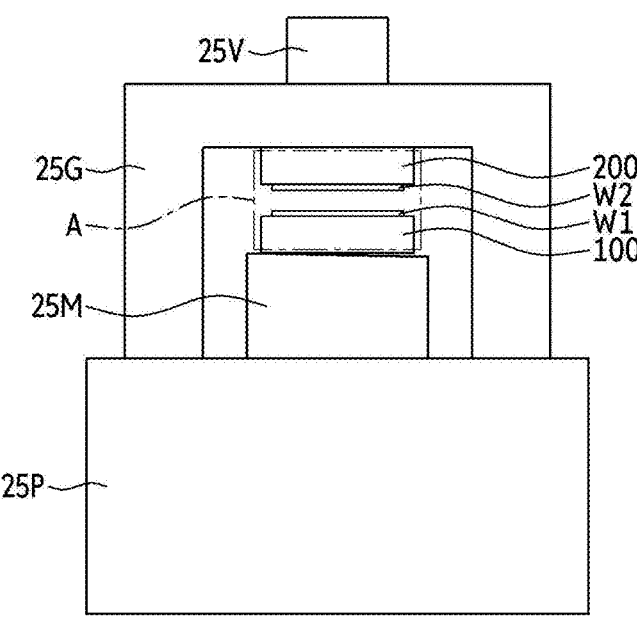
FIG. 2 is a front view for explaining the substrate bonding apparatus according to some embodiments of the present disclosure.

FIG. 2 is a diagram for explaining the substrate bonding apparatus according to some embodiments of the present disclosure.

Referring to FIG. 2, the substrate bonding apparatus 25 may include a body 25P, a stage 25M, a gantry 25G, a vision unit 25V, a lower module 100, and an upper module 200.

The body 25P may support the stage 25M and the gantry 25G. In some embodiments, the body 25P may be provided with an air pressure system, and the stage 25M may be operated by air pressure.

The stage 25M may be provided above the body 25P, and may be provided with, for example, a multi-axis motor to enable six degrees of freedom of movement. By such a stage 25M, height/position/placement of the lower module 100 may be adjusted in accordance with the upper module 200.

The gantry 25G is provided above the body 25P and may support the vision unit 25V and the upper module 200. As an example, the gantry 25G may be provided in the form in which a delivery direction of the substrates W1 and W2 is opened so that the substrates W1 and W2 may be introduced by the transport robot of the second transport module 35.

The vision unit 25V is a device for detecting the substrates W1 and W2, and may be provided as a camera as an example. Although not shown in the drawings, the substrates

W1 and W2 may be provided with marks, and the marks and/or chips may be photographed using the vision unit 25V to detect/grasp the shape, size, and/or scale-compensation amount of the chips/pattern of the substrates W1 and W2.

The lower module 100 and the upper module 200 are disposed to be opposite to or facing each other at the top and bottom, and may bond the first substrate W1 disposed in the lower module 100 and the second substrate W2 disposed in the upper module 200 using a covalent bonding method.

The substrate bonding apparatus 25 to be described below is explained as an example in which the lower module 100 is disposed below the upper module 200 and includes a first chuck 110, deformation units 120 and 130, and a deformation plate 140, and the upper module 200 is disposed above the lower module 100 and includes a second chuck 210 and a top pusher 220, for bonding the first substrate W1 and the second substrate W2. However, the present disclosure is not limited thereto.

As another modified example, the first chuck 110, the deformation units 120 and 130, and the deformation plate 140 may be disposed at the top, and the top pusher 220 may be disposed at the bottom. That is, the lower module 100 and the upper module 200 may be rotated by 180 degrees, such that the upper and lower positions may be changed. In this way, various modified examples of the substrate bonding apparatus 25 are possible.

The lower module 100 will be described below with reference to the drawings.

Figure 3:
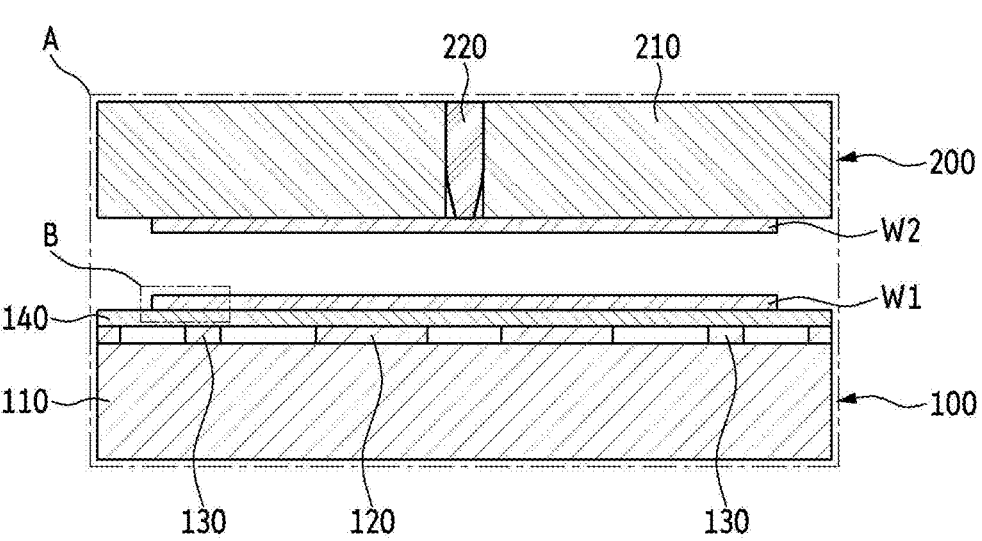
FIG. 3 is a diagram showing a region A of FIG. 2.
Figure 4:
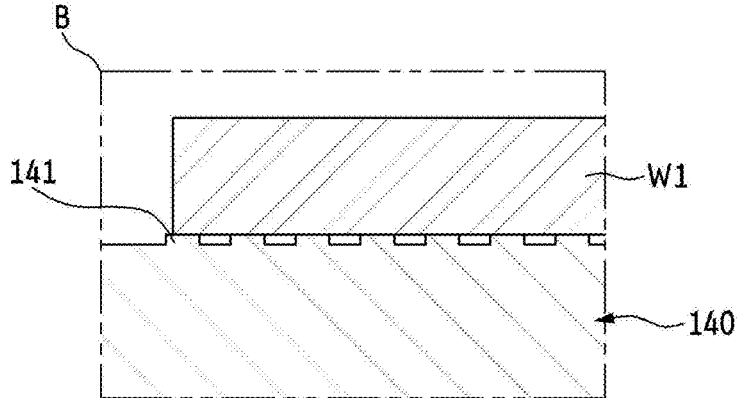
FIG. 4 is a diagram showing a region B of FIG. 3.

FIG. 3 is a diagram showing a region A of FIG. 2, and showing the lower module and the upper module, and FIG. 4 is a diagram showing a region B of FIG. 3.

FIGS. 5 to 8 are diagrams sequentially showing the process of bonding the second substrate W2 to the first substrate W1 subsequent to FIG. 3.

Referring to FIGS. 3 to 8, the substrate bonding apparatus 25 according to some embodiments of the present disclosure includes the lower module 100 and the upper module 200.

First, the lower module 100 may include a first chuck 110, a deformation plate 140, and deformation units 120 and 130.

The first chuck 110 may be disposed on the stage 25M (see FIG. 2), may be raised and lowered by the operation of the stage 25M, and may have a diameter larger than that of the first substrate W1. The first chuck 110 may be provided with a vacuum pump so that the first substrate W1 may be vacuum-adsorbed via the deformation plate 140. The vacuum pump may apply a vacuum pressure for vacuum suction or may release the vacuum pressure to release the vacuum suction.

However, the first chuck 110 and the second chuck 210 are not limited to those provided with a vacuum pump for supporting the substrates W1 and W2, and various modified examples such as a mechanical clamping method are possible as long as they are not inconsistent with the present disclosure.

The deformation plate 140 may support the first substrate W1. The deformation plate 140 may be provided above the first chuck 110 in a variable manner. The deformation plate 140 may be provided so that a flat scale plate is deformed into a convexly hemispherical shape to provide a scale-compensation amount for the first substrate W1 in accordance with the second substrate W2.

For example, the deformation plate 140 may be provided as a scale plate made of aluminum or silicon carbide (SiC), but this is only an example and the present disclosure is not limited thereto.

In order to deform the deformation plate 140 into a hemispherical shape, the edge of the deformation plate 140 is fixed to the first chuck 110 by, for example, a clamp unit 170 (see FIG. 9), and an inner part of the edge of the deformation plate 140 may be deformed into a convex shape (e.g., upwardly convex shape) by an external force generated by the operation of the deformation units 120 and 130.

Figure 5:
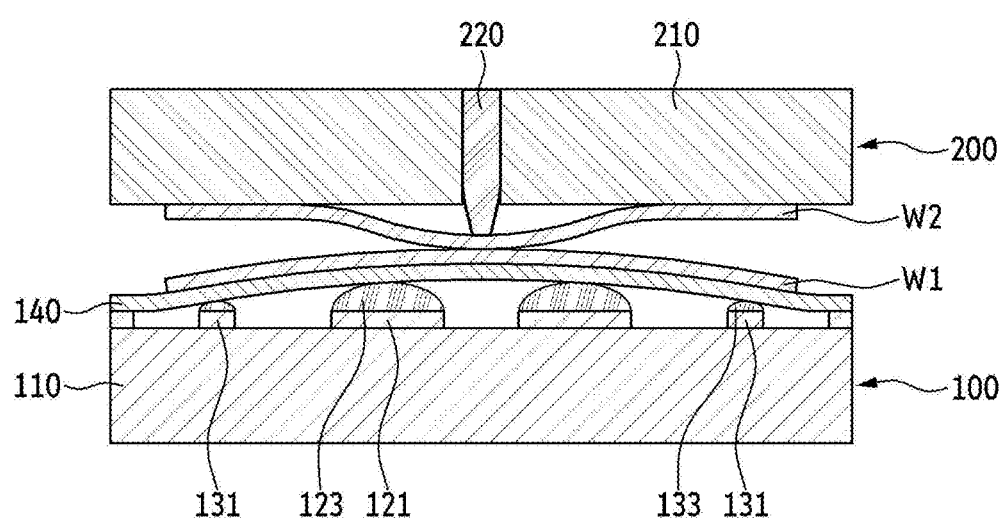
FIG. 5 is a diagram showing a status in which a pusher of the substrate bonding apparatus according to some embodiments of the present disclosure is moved downward.

When the deformation plate 140 is deformed into a convexly hemispherical shape, the first substrate W1 supported by vacuum suction on the deformation plate 140 may be deformed into a convexly hemispherical shape in accordance with the shape of the deformation plate 140 (see FIG. 5).

The deformation plate 140 may be formed with a plurality of vacuum holes for vacuum suction of the first substrate W1. In addition, the deformation plate 140 may have an embossing and/or dam 141 (with alternating grooves) formed on the upper face provided as a suction face so that the first substrate W1 is not bent in a specific direction or subjected to an external force at the time of vacuum suction (see FIG. 4).

In addition, the deformation plate 140 according to some embodiments of the present disclosure may be deformed into a convexly hemispherical shape to provide the scale-compensation amount of the first substrate W1, but excessive expansion and insufficient expansion occurs adjacent to an edge region (which may be an outer region of a reference line) of the first substrate W1, and the scale-compensation amount is required to be adjusted, which may be adjusted by the deformation units 120 and 130.

The deformation units 120 and 130 are configured to change the shape of the deformation plate 140 and/or adjust the scale-compensation amount of the first substrate W1, and may be provided in the space between the first chuck 110 and the deformation plate 140.

As an example, the deformation units 120 and 130 may include a main supporter 120 and an auxiliary support unit or auxiliary supporter 130.

The main supporter 120 may press the deformation plate 140 in an upward direction so that the deformation plate 140 has a hemispherical shape. The volume of the main supporter 120 may expand by the inflow and outflow of fluid to press the deformation plate 140, or the volume thereof may be reduced so that the deformation plate 140 returns to a flat plate. The fluid flowing in and out of the deformation units 120 and 130 may be, for example, air, but is not limited thereto, and may be provided as water, compressed air, and/or an inert gas, etc.

In some embodiments, the main supporter 120 may be deformed by the inflow and outflow of fluid, but is not limited thereto, and electricity, a magnetic field, and/or a shape memory metal may be applied and associated with a feedback control sequence.

Figure 19:
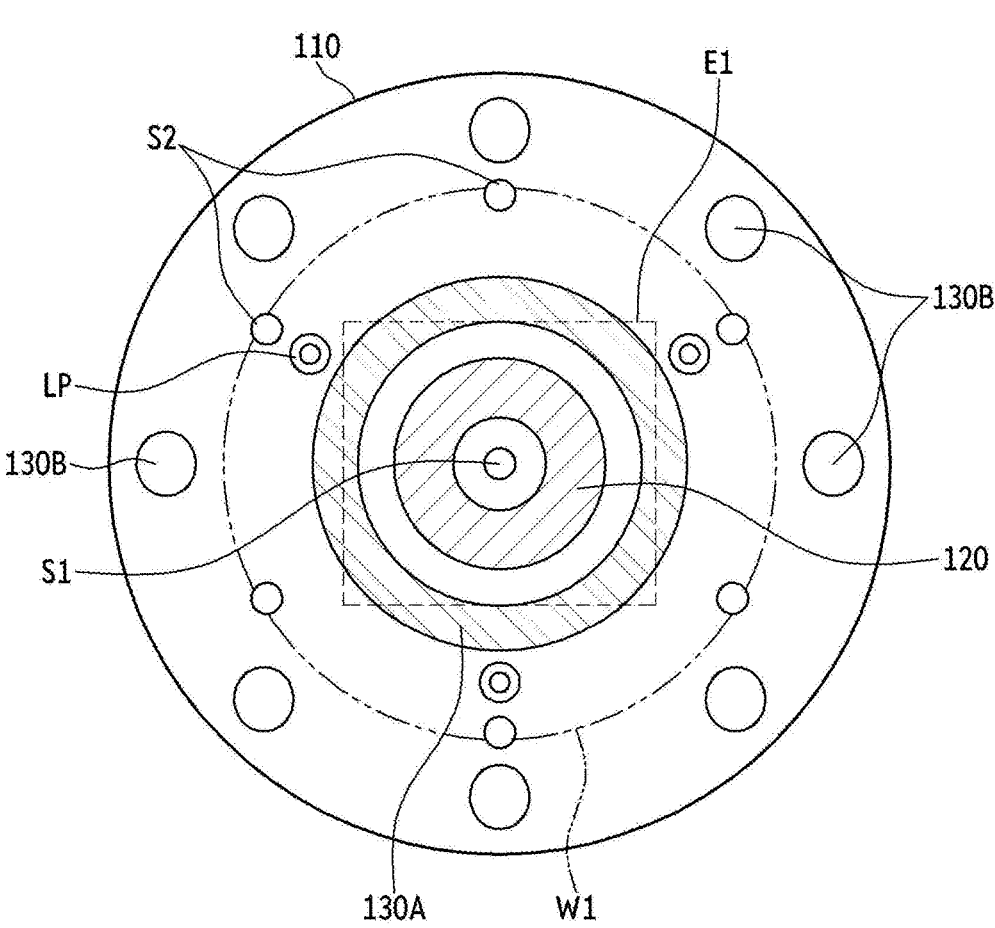
FIG. 19 is a plan view showing a lower module according to some embodiments of the present disclosure.

Furthermore, the main supporter 120 may be provided as a closed curve structure, and as an example, it may have a ring shape with a penetrating center (see FIG. 19). As a result, a first sensor S1 and a first target T1 may be provided as a single unit at the center part of the main supporter 120 without interfering with the main supporter 120.

For example, if the main supporter is provided in a hemispherical shape located at the center part of the deformation plate 140 without having in a ring shape, it is difficult to provide the first sensor S1 and the first target T1 inside the hemispherical main supporter to change the center height of the deformation plate 140.

That is, the thickness of the main supporter necessarily changes with the volume expansion/reduction, in other words, elasticity change, change over time, hysteresis and/or deterioration phenomenon of the rubber material necessarily occurs. Accordingly, when the height change of the main supporter is measured inside the hemispherical main supporter, an error occurs, in which the thickness that changes by the material characteristics of the main supporter is sensed as a height change. This necessarily acts as a factor that degrades the sensing accuracy of the first sensor S1 of the substrate bonding apparatus 25 that provides a scale-compensation amount in units of micrometers.

However, since the main supporter 120 according to some embodiments has a structure with a penetrating center like a ring shape, the first sensor S1 and the first target T1 are provided at the center part of the main supporter 120 without interfering with the main supporter 120, and the first sensor S1 may sense the height of the deformation plate 140 regardless of the change over time, hysteresis and/or deterioration of the main supporter 120. Accordingly, the sensing accuracy may not be degraded, and the deformation units 120 and 130 may be controlled in accordance with the process conditions.

Furthermore, since the plurality of domes are not disposed in a virtual ring shape in the main supporter 120 that modifies the shape of the deformation plate 140, but the single ring-shaped main supporter 120 forms the shape deformation of the deformation plate 140, the deformation plate 140 is pressed by a line contact in the ring shape of the main supporter 120 without pressing the deformation plate 140 by a point contact at multiple points. Accordingly, a uniform scale-compensation amount is provided in the radial direction and local reverse direction error may not occur.

However, the main supporter 120 is not limited to a ring shape, and various modified examples, such as a polygonal shape, a butterfly shape or a rod shape, are possible such as an example in which a center is penetrated in the same or similar manner as the second dome 130B (see, e.g., FIG. 10) and at least a part is in line contact.

In addition, since the main supporter 120 is provided in a ring shape and does not press the center part of the deformation plate 140, that is, the center of the deformation plate 140 is not pressed in a point contact manner, the force is not concentrated on the deformation plate 140 in the point contact manner, and the problem of degradation of the performance of the center part alignment may be reduced or prevented.

In addition, since the deformation plate 140, whose shape is deformed by the main supporter 120, does not start to deform at a peak point (the highest point of the dome-shaped deformation plate 140), but deforms from below the peak point due to the ring shape, the deformation force does not concentrate at the center part, which is the peak point, and the shape of the deformation plate 140 may be deformed evenly up to the edge, and the scale-compensation amount may be provided evenly in accordance with the design.

In addition, since the shape of the deformation plate 140 is deformed by applying a positive pressure to the main supporter 120, which has a separate space provided below the deformation plate 140, rather than applying positive pressure to the space between the first chuck 110 and the deformation plate 140 to deform the shape of the deformation plate 140, there is no problem of air pressure leaking outside the space between the first chuck 110 and the deformation plate 140, and it may be controlled without considering air pressure leakage. Since there is no need to provide an O-ring structure between the first chuck 110 and the deformation plate 140 to seal the space between the first chuck 110 and the deformation plate 140, the problem of twisting of the deformation plate 140 due to the reaction force of the O-ring may be prevented. That is, the accuracy limit of the substrate bonding apparatus 25 that requires micrometer-level accuracy may be improved.

The main supporter 120 may include, for example, a first base 121 and a first expander 123.

The first base 121 may be provided as a material that does not deform, unlike the first expander 123 having a deformed shape, or may be provided as a strength/thickness that does not deform, and the first expander 123 is prevented from moving away from the design position while being deformed, thereby preventing the manufacturing error from increasing in the course of repeating the process.

The first base 121 may be provided above the first chuck 110, and the upper part is opened and a hollow may be formed so that the first expander 123 may be inserted. As an example, the first base 121 may be provided in a dam structure with an open top in a ring shape so that the first expander 123 is exposed. That is, when the first expander 123 is provided in a tube shape, the first base 121 may be provided in a wall face structure that surrounds each of an inside and an outside of the tube.

Since such a first base 121 may restrict a lateral expansion of the first expander 123 and induce an upward expansion, it is not necessary to supply excessive fluid to the fluid extending in the lateral direction, and fluid control may be accurate and easy.

The first expander 123 may be supplied with fluid from a first fluid regulator, and an upper end protruding upward from the first base 121 due to volume expansion may press the deformation plate 140. Alternatively, the first fluid regulator may collect the fluid or discharge the fluid to the outside, and the first expander 123 may be folded at least partially and stored in the hollow of the first base 121 due to volume reduction.

Here, since the first expander 123 of the main supporter 120 deforms the shape of the deformation plate 140 with a ring-shaped distributed load rather than a point contact, and is provided as an indirect method using positive pressure rather than a direct pressure method using an actuator, it is possible to reduce concerns about performance changes due to cracks and/or wear of the deformation plate 140 that may occur due to the direct pressure method.

As an example, the first expander 123 may be made of a rubber material, and may have a Shore hardness of 50 to 60. As another example, the first expander 123 may be provided as a shape memory metal that covers an upper end of the first base 121.

The first expander 123 according to some embodiments may be provided, but not limited to, in the form of a ring-shaped tube. As another example, the first expander 123 may be provided in a structure that covers the space of the first base 121 and seals the space between the first base 121 and the first expander 123 so that the fluid may flow in and out. This may have the same structure as the auxiliary support unit 130, which will be explained with reference to FIGS. 12 and 13.

The first expander 123 may be made of a rubber material, and its volume may be variable by the inflow and outflow of the fluid. Since the first expander 123 is provided in the form of being simply inserted into the inside of the first base 121 and does not need to be fixed to the first chuck 110 with adhesive, the first expander 123 needs only to have a thickness that does not tear when pressing the deformation plate 140, and since the first expander 123 does not need to be provided excessively thick, the first expander 123 which needs to be provided in a narrow space can be easily installed on the chuck 110. However, this is merely an example, and the first expander 123 may be fixed to the first chuck 110 with an adhesive.

In some embodiments, the main supporter 120 is explained as an example to include the first base 121 and the first expander 123. However, various modified examples are possible such as an example in which the first base 121 is omitted and only the first expander 123 is provided to press the deformation plate 140.

The auxiliary support unit 130 may be provided outside the main supporter 120, and various modified examples are possible, such as examples in which the volume is variable by the inflow and outflow of fluid in the same or similar manner as the main supporter 120, or electricity, magnetic field, and/or shape memory metal may be applied.

For example, the auxiliary support unit 130 may include a second base 131 and a second expander 133.

Here, the second base 131 may be provided in a dam structure in the same or similar manner as the first base 121, and the second expander 133 may have a tube shape in the same or similar manner as the first expander 123 or may have a structure in which the volume is adjusted by the inflow and outflow of fluid into and out of a sealed space while covering the second base 131. That is, the second base 131 and the second expander 133 may have the same mechanism as the first base 121 and the first expander 123. Furthermore, the second expander 133 may be made of the rubber material in the same or similar manner as the first expander 123, and may have a Shore hardness of 50 to 60.

Meanwhile, the auxiliary support unit 130 is not limited to an example in which a volume is variable by the inflow and outflow of fluid, and various modified examples are possible, such as examples in which the protruding length may be changed so that the height is adjusted as another example, and it may be provided as an actuator whose protruding length is changed as an example.

The upper module 200 may include a second chuck 210 and a top pusher 220.

The second chuck 210 may support the second substrate W2 opposite to the first substrate W1.

The second chuck 210 may be disposed on the gantry 25G, and may have a diameter larger than that of the second substrate W2. The second chuck 210 may be provided with a vacuum pump to vacuum-adsorb the second substrate W2 in the same manner as the first chuck 110. The vacuum pump may apply vacuum pressure for vacuum suction or release vacuum pressure to release the vacuum suction.

Further, according to a modified example embodiments, the second chuck 210 may be in a status which does not vacuum-adsorb the entire face of the second substrate W2, but vacuum-adsorbs a part of the second substrate W2 and release the vacuum suction on the remaining region for scale-compensation amount adjustment. This will be explained referring to FIGS. 26 and 27.

The top pusher 220 may penetrate or extend through the second chuck 210 to push the second substrate W2 in the downward direction. However, the upper module 200 is not limited to an example that presses the second substrate W2 in the downward direction by the push operation of the top pusher 220, and various modified examples are possible, such as examples in which a pressing mechanism expands through air or gas injection, and the second substrate W2 may be bonded between the first substrates W1 from the center part outward through the expansion operation of the urging means as another example.

Further, although the top pusher 220 is illustrated as having a fin shape in the some embodiments, various modified examples are possible, such as examples in which a center part may be provided as a penetrating pillar (e.g., a cylinder) so that the lower face has a ring cross-section.

The substrate bonding apparatus 25 may perform a bonding process as follows.

Referring to FIGS. 3 and 4, the first substrate W1 may be supported by the lower module 100 by vacuum suction, and the second substrate W2 may be supported by the upper module 200 by vacuum suction.

At this time, a status may be achieved in which the deformation units 120 and 130 of the lower module 100 do not press the deformation plate 140, and the top pusher 220 of the upper module 200 does not press the second substrate W2. That is, the lower module 100 and the upper module 200 may achieve a status in which the first substrate W1 and the second substrate W2 are only vacuum adsorbed, and both the first substrate W1 and the second substrate W2 may achieve a flat status.

Next, referring to FIG. 5, first, the deformation units 120 and 130 of the lower module 100 may press the deformation plate 140, and the deformation plate 140 may have a status that is deformed into a hemispherical shape. When the shape deformation of the deformation plate 140 is completed and the first substrate W1 is also deformed into a hemispherical shape, the center part of the second substrate W2 vacuum-adsorbed to the upper module 200 may then protrude downward by the top pusher 220 (e.g., downwardly convex). At this time, the center part of the second substrate W2 abuts against the center part of the first substrate W1 deformed into a hemispherical shape.

Figure 6:
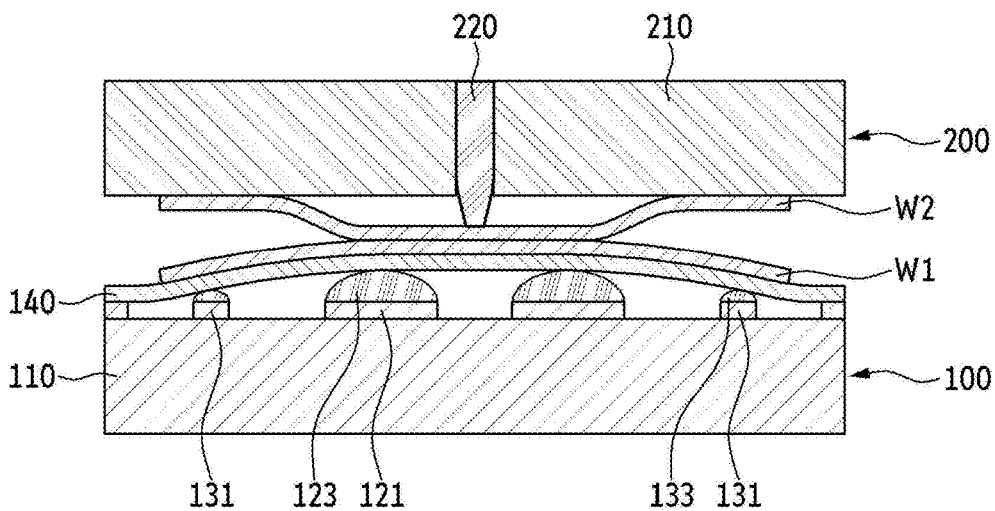
FIG. 6 is a diagram showing a process in which a second substrate is attached to a first substrate in the substrate bonding apparatus according to some embodiments of the present disclosure.
Figure 7:
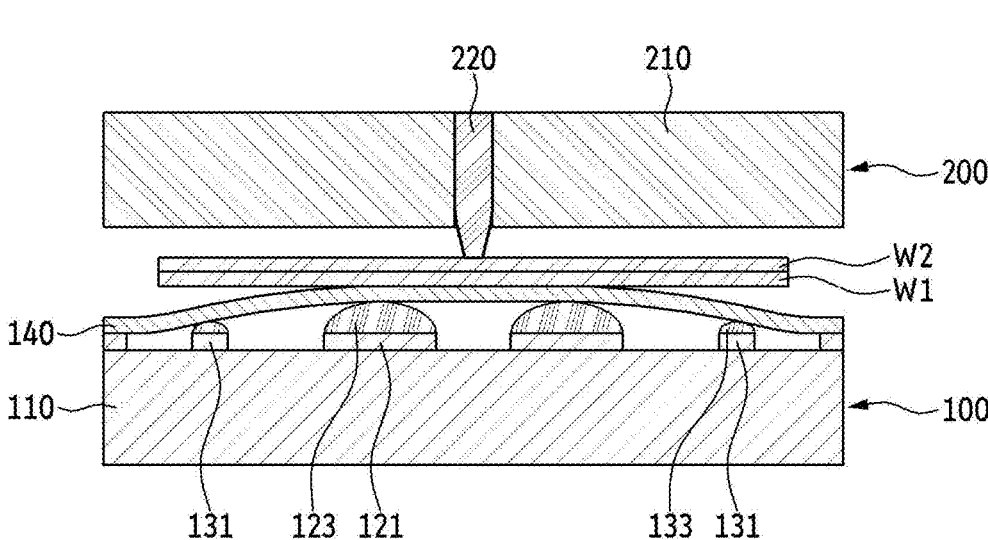
FIG. 7 is a diagram for explaining a status in which the first substrate and the second substrate are bonded in the substrate bonding apparatus according to some embodiments of the present disclosure.

Next, referring to FIG. 6, hydroxyl groups (—OH) formed on the surfaces of the substrates W1 and W2 form dangling bonds on the surfaces of the substrates W1 and W2, and the bonding faces of the substrates W1 and W2 are diffused, and then, as shown in FIG. 7, the bonding of the substrates W1 and W2 may be completed.

Figure 8:
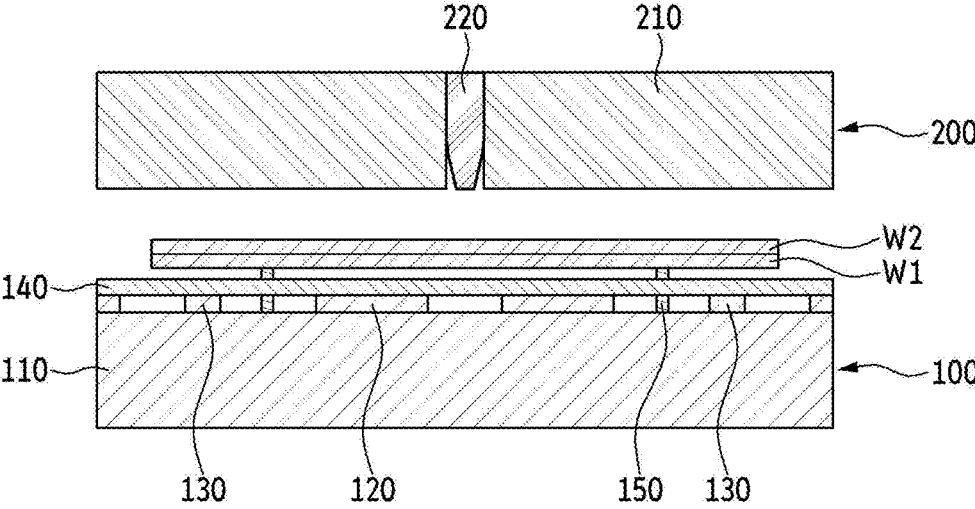
FIG. 8 is a diagram for explaining a status in which lift pins protrude in the substrate bonding apparatus according to some embodiments of the present disclosure.

Next, referring to FIG. 8, the substrates W1 and W2 subjected to bonding may be transported by the transport robot (see FIG. 1) of the second transport module 35, the deformation plate 140 returns to a flat shape to this end, and the substrates W1 and W2 achieve a status that is raised and lowered from the deformation plate 140 by the lift pin 150.

In some embodiments, because the main supporter 120 and the lift pin 150 to which a positive pressure is applied are provided separately, that is, the lift pin 150 is provided so as not to penetrate the main supporter 120, the lift pin 150 does not damage the seal structure of the main supporter 120, and structural stability may be maintained.

Hereinafter, various modified examples will be explained referring to the drawings, and repeated explanations of the same configuration having the same function may not be provided in the interest of brevity.

Figure 9:
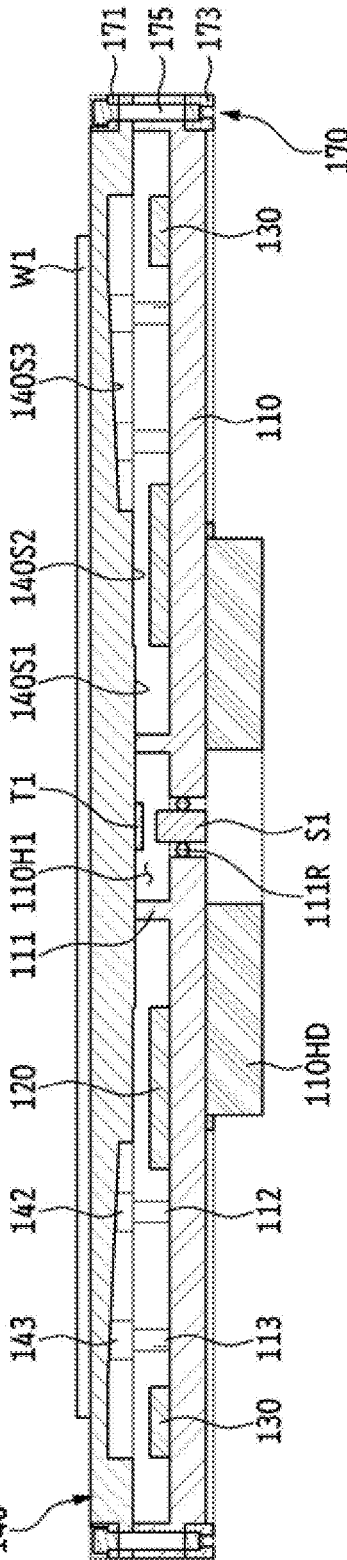
FIG. 9 is a diagram for explaining a lower module according to some embodiments of the present disclosure.

FIG. 9 is a diagram for explaining a lower module according to some embodiments of the present disclosure.

Referring to FIG. 9, the lower module 100 according to some embodiments may include the first chuck 110, the deformation plate 140, and the deformation units 120 and 130 explained referring to FIGS. 3 to 8, and may include a clamp unit 170.

The deformation plate 140 of the first embodiment may have a thickness of the edge region 140S3 smaller than the thickness of the center part or region 140S1. In addition, the deformation plate 140 may have a step formed in a middle or intermediate region S140S2 between the center part 140S1 and the edge region 140S3. That is, the thickness of the deformation plate 140 may be formed to be smaller from the center part 140S1 toward the edge region 140S3.

The thickness of the deformation plate 140 may be different to make it easier for the deformation plate 140 to deform into a convex hemispherical shape. That is, this is for the purpose of utilizing a condition in which the deformation rate is small in the thicker thickness of the deformation plate 140, and the deformation rate is large in the thinner thickness.

Since the substrate bonding apparatus 25 according to some embodiments bonds the substrates W1 and W2 on which micrometer-sized chips are provided, the height variation amount may not be large, such as less than 1 cm. However, by making the thickness of the deformation plate 140 small in the outward radial direction, the deformation amount may be small at the center part of the deformation plate 140 and the curvature may be formed to be large at the edge region 140S3.

The deformation plate 140 may also have an inclined face that is inclined upward at least in part in the edge region 140S3. The inclined face may have an inclination angle of 10 degrees or less, for example, an inclination angle of 1 degree or more and 5 degrees or less. In this way, the deformation plate 140 may be provided as a structure that is easily deformed into a curved shape.

The deformation plate 140 may include a first scale-compensation region and a second scale-compensation region that are divided in a clockwise/angle direction. The first scale-compensation region may have a thickness thinner than that of the second scale-compensation region. As a result, it is possible to distinguish a distorted region in which the warpage shape significantly protrudes from a region in which the warpage phenomenon is small, in accordance with the first substrate W1 such as a saddle substrate distorted by the warpage phenomenon, and to apply a scale-compensation amount for each region.

Here, the saddle substrate may mean a substrate in which a different curvature of the first substrate W1 is generated by the warpage phenomenon, and a saddle (horse saddle) shape is generated due to the generation of a distorted region in which the warpage shape significantly protrudes.

The first chuck 110 may include rib units or ribs 111, 112, 113, 142 and 143 and sensor units S1, S2, and T1.

The rib units 111, 112, 113, 142, and 143 are configured to prevent the deformation plate 140 from sagging, and may support the deformation plate 140 with a gap formed between the first chuck 110 and the rib units.

For example, the rib units 111, 112, 113, 142, and 143 may include a first rib 111 and second ribs 112, 113, 142, and 143.

The first rib 111 is configured to prevent the center part 140S1 of the deformation plate 140 from sagging under a situation in which the bonding process is not performed, i.e., under a situation in which the deformation units 120 and 130 do not operate. The first rib 111 may be provided in a cylindrical shape with an open top at the center part of the ring-shaped main supporter 120.

The first rib 111 may be provided in a cylindrical shape, i.e., the center part of the first rib 111 is formed as hollow, and the first sensor S1 may be disposed at the center part of the first rib 111.

Furthermore, the first rib 111 may be fixed to the first chuck 110 or may be provided integrally with the first chuck 110, but is not limited thereto.

The second ribs 112, 113, 142, and 143 are configured to prevent the middle region S140S2 and/or the edge region 140S3 of the deformation plate 140 from sagging, and may be provided outside the main supporter 120. In some embodiments, the second ribs 112, 113, 142 and 143 may be disposed in the second scale-compensation region, for example, when the first scale-compensation region of the deformation plate 140 is thinner than the second scale-compensation region, but is not limited thereto, and the second ribs 112, 113, 142 and 143 may be disposed in the first scale-compensation region.

A plurality of second ribs 112, 113, 142 and 143 may be provided in a radius direction and/or a radial direction. The second ribs 112, 113, 142 and 143 may be provided as a single protruding structure, but is not limited thereto, and may be provided as upper and lower structures, and may include the lower ribs 112 and 113 and the upper ribs 142 and 143.

The lower ribs 112 and 113 may be provided on the upper face of the first chuck 110. The upper ribs 142 and 143 may be provided on the lower face of the deformation plate 140, and may be opposite to the lower ribs 112 and 113 and have a larger diameter than the lower ribs 112 and 113. Further, various modified examples are possible, such as examples in which the upper ribs 142 and 143 is directly connected to the lower face of the deformation plate 140 or may be connected via a separate plate.

The sensor units S1, S2, and T1 may sense the height of the deformation plate 140.

For example, the sensor units S1, S2, and T1 may include a first sensor S1, a first target T1, a second sensor S2, and a second target.

The first sensor S1 may be provided at the center part of the main supporter 120 and the first rib 111. The first target T1 may be provided at the center part on the lower face of the deformation plate 140, and may be provided as a sensing face of the first sensor S1.

The second sensor S2 (see FIG. 19) may be provided at a position opposite to the edge of the first substrate W1 outside the main supporter 120. The second target may be provided as the sensing face of the second sensor S2 on the lower face of the deformation plate 140.

The first sensor S1 and the second sensor S2 may be provided as sensors with a resolution, repeatability, and hysteresis of less than 100 nm so that ECAT communication is enabled, and may be provided as, for example, a capacitance sensor, an interferometer, a confocal displacement sensor, or an eddy current sensor. However, when the deformation plate 140 is provided as a ceramic material, it may be difficult for the capacitance sensor to sense the ceramic material. Therefore, the first target T1 and the second target may be provided as a metal material at a position opposite to the first sensor S1 and the second sensor S2 so that the first sensor S1 and the second sensor S2 may sense a metal.

As an example, various modified examples are possible, such as examples in which the first target T1 and the second target are provided in such a manner that metal powder is coated on the lower face of the deformation plate 140, or a sticker coated with metal is attached, or may be provided as a structure in which a metal plate is bonded In addition, the space between the first chuck 110, on which the first sensor S1 and the first target T1 are provided, and the deformation plate 140 may be sealed so as not to become a leak point, and for example, an O-ring 111R may be provided. Here, the leak point may be an external space of the main supporter 120 used to eliminate factors that change over time, such as hysteresis, in the center region and the edge region of the lower space of the deformation plate 140, and may become a factor which reduces structure reliability that may applies negative pressure to the inside of the first chuck 110. Accordingly, in some embodiments, an O-ring 111R is provided.

In addition, the sensor units S1, S2, and T1 may include a grounding structure for reducing fluctuations due to factors such as hysteresis in the electrical transmission signal inside the first chuck 110, and a grounding cable of the grounding structure may be provided as a feed-through structure that connects the outside of the first chuck 110 to the first target T1 to prevent leakage.

The deformation units 120 and 130 may perform feedback through the height change sensed by the sensor units S1, S2, and T1. The feedback control structure may be a PID control sequence, which senses the height of the deformation plate 140 in real time by measuring the displacement of the first target T1 at the center part of the deformation plate 140 in real time, and if a height value of the deformation plate 140 at the time of detection is greater than a specified recipe value, i.e., greater than a preset value, the pressure corresponding to the minimum resolution of a regulator is reduced, and if the pressure is smaller than the preset value, the pressure is applied to converge the height of the deformation plate 140 to the preset value.

Meanwhile, the second sensor S2 may be omitted. At this time, the auxiliary support unit 130 is operated first, and as an example, a positive pressure is applied to the auxiliary support unit 130, and the second sensor S1 detects the height of the variable deformation plate 140, and then a positive pressure is applied to the main supporter 120, and the first sensor S1 may detect the height of the variable deformation plate 140. In this way, various modified examples are possible, such examples in which the first sensor S1 may detect the change in height of the variable deformation plate 140 caused by the auxiliary support unit 130 as well as the center part of the variable deformation plate 140, and the single first sensor S1 may also perform the function of the second sensor S2.

The clamp unit 170 may restrain the variable deformation plate 140 so that the variable deformation plate 140 is not detached from the first chuck 110. For example, the clamp unit 170 may include a first ring 173, a second ring 171, and a coupler 175.

The first ring 173 may be provided below the first chuck 110. The second ring 171 may be provided above the deformation plate 140. That is, the first chuck 110 and the deformation plate 140 may be disposed between the first ring 173 and the second ring 171.

The first chuck 110 and the deformation plate 140 between the first ring 173 and the second ring 171 are restrained by the first ring 173 in the downward direction, and are restrained by the second ring 171 in the upward direction, and it is not necessary to screw the coupler 175 into the first chuck 110 and the deformation plate 140.

Here, the coupler 175 is coupled to the first ring 173 and the second ring 171, but is not bolted to the deformation plate 140 and the first chuck 110, and may simply penetrate or extend through the deformation plate 140 and the first chuck 110. At this time, the coupler 175 may be provided as a bolt or other fastener that is screwed into at least one of the first ring 173 and the second ring 171 and prevents detachment by a (bolt) head on the remaining ring, and the coupler 175 may be bolted only to the first ring 173 and/or the second ring 171.

For example, the coupler 175 may be provided as a bolt with a diameter that is not bolted to the deformation plate 140 and the first chuck 110. That is, the coupler 175 is provided as a bolt having a diameter smaller than through holes of each of the deformation plate 140 and the first chuck 110 at positions corresponding to the bolt holes of the first ring 173 and the second ring 171 to which the coupler 175 is bolted, and may not be bolted to the deformation plate 140.

Alternatively, the peripheral face of the coupler 175 corresponding to the positions of the deformation plate 140 and the first chuck 110 may be formed by a plain (e.g., smooth) without forming a screw thread, so that the coupler 175 is not screwed into the deformation plate 140 and the first chuck 110.

Such a clamp unit 170 restrains the deformation plate 140 disposed between the first ring 173 and the second ring 171 to the first chuck 110, but is not bolted to each of the deformation plate 140 and the first chuck 110, thereby preventing the deformation plate 140 and the first chuck 110 from being deformed by bolting or from being damaged by excessive bolt tightening force.

In addition, when the deformation plate 140 and the first chuck 110 are coupled with a bolt, for example, when the shape of the deformation plate 140 is deformed, the pressing force is differently formed between the region in which the bolt is coupled and its surroundings, and a warpage shape may be formed in the deformation plate 140. However, since the lower module 100 according to some embodiments has a structure in which the bolt is not screwed into the deformation plate 140 and the first chuck 110 but simply penetrates through them, warpage of the deformation plate 140 and/or the first chuck 110 may be reduced or prevented.

In some embodiments, the auxiliary support unit 130 of the deformation units 120 and 130 is shown as being provided as a single structure/unit in the radial direction of the main supporter 120, but the present disclosure is not limited thereto.

Figure 10:
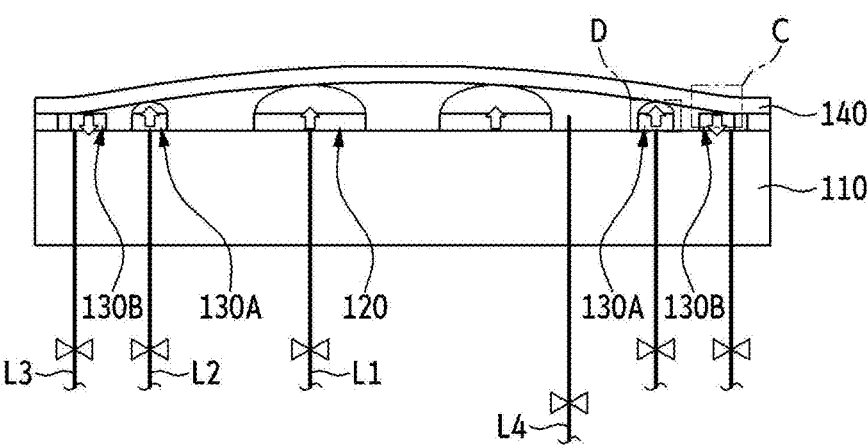
FIG. 10 is a front view showing a lower module according to some embodiments of the present disclosure.

A plurality of auxiliary support units 130 may be provided in the radial direction of the main supporter 120, such as the first dome 130A and the second dome 130B, as shown in FIG. 10. According to a modified example, the auxiliary support unit 130 may include the first dome 130A and/or the second dome 130B.

That is, various modified examples are possible, such as an example in which the auxiliary support unit 130 may include the first dome 130A, include the first dome 130A and the second dome 130B, or include only the second dome 130B.

In addition, a chuck holder 110HD that connects the first chuck 110 and the stage 25M may be fixed to the first chuck 110 by vacuum suction so that bolting is omitted, but is not limited thereto.

Other modified examples will be described below with reference to the drawings.

However, it should be noted that other embodiments are possible by combining one or more of the example embodiments of the present disclosure and known techniques.

For example, the clamp unit 170 and the sensor units S1, S2, and T1 are not limited to those described with reference to FIG. 9, and may be provided to any of the example embodiments described herein. By way of further example, first dome 130A and the second dome 130B described with reference to FIG. 10 may be provided to any of the example embodiments described herein.

Figure 11:
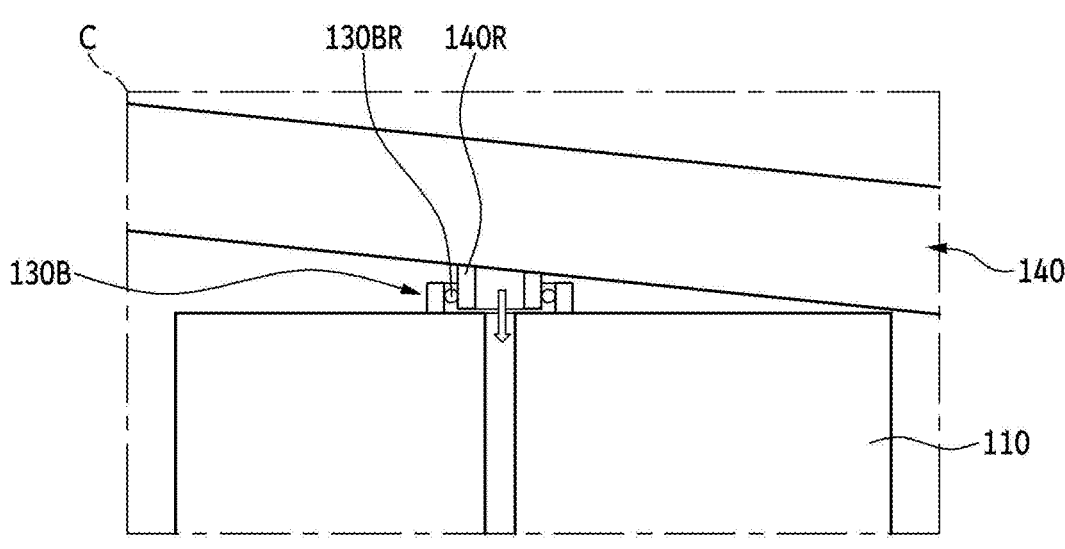
FIG. 11 is a diagram showing a region C of FIG. 10.
Figure 12:
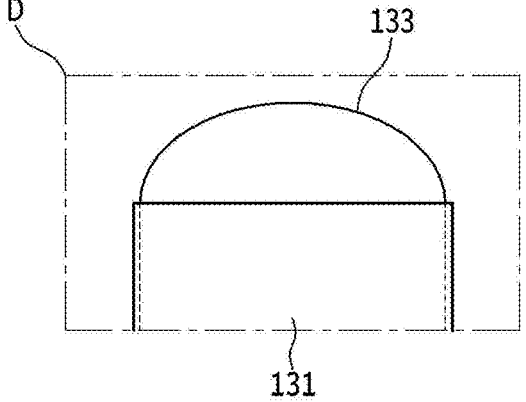
FIG. 12 is a diagram showing a region D of FIG. 10.

FIG. 10 is a front view showing a lower module according to some embodiments of the present disclosure, FIG. 11 is a diagram showing a region C of FIG. 10, and FIG. 12 is a diagram showing a region D of FIG. 10. FIG. 12 is a diagram showing a status in which the second dome in FIG. 12 is contracted.

Referring to FIGS. 10 to 13, the lower module 100 of the second embodiment may include a first chuck 110, a deformation plate 140, and deformation units 120 and 130 in the same or similar manner as those described above.

Meanwhile, the lower module 100 according to some embodiments may further include an auxiliary line L4 and a second fluid regulator so that the internal pressure outside the deformation units 120 and 130 is adjusted in the space between the first chuck 110 and the deformation plate 140. The second fluid regulator may be provided as a compressor and/or a vacuum pump in the same/similar manner as the first fluid regulator connected to the main lines L1, L2, and L3, and may apply a negative pressure to the space between the first chuck 110 and the deformation plate 140 to form a vacuum atmosphere, but is not limited thereto.

As another example, a positive pressure may be applied to the space between the first chuck 110 and the deformation plate 140 to adjust the scale-compensation amount of the first substrate W1. However, since the auxiliary line L4 and the second fluid regulator assist in the shape deformation of the deformation plate 140, a fluid of a smaller flow rate and/or a smaller hydraulic pressure than the fluid amount/hydraulic pressure passing through the first fluid regulator may pass through the auxiliary line L4 and the second fluid regulator.

That is, according to a modified example, the shape of the deformation plate 140 is deformed by the deformation units 120 and 130 abutting against the deformation plate 140, and at the same time, the space between the first chuck 110 and the deformation plate 140 is formed in a vacuum atmosphere, and the scale-compensation amount of the first substrate W1 by the deformation plate 140 may be adjusted. Alternatively, the shape of the deformation plate 140 is mainly deformed (e.g., 90% or more of the shape deformation factor) by the deformation units 120 and 130, and the shape of the deformation plate 140 is additionally deformed (e.g., 10% or less of the shape deformation factor) by the positive pressure additionally applied to the space between the first chuck 110 and the deformation plate 140 by the auxiliary line L4 and the second fluid regulator, and the scale-compensation amount may be adjusted.

The positive pressure and/or the negative pressure may be provided to the deformation units 120 and 130 of the second embodiment. In order to provide the positive pressure and/or the negative pressure to the deformation units 120 and 130, the deformation units 120 and 130 may be provided with main lines L1, L2, and L3 through which fluid flows.

The fluid may individually flow in and flow of out the main lines L1, L2, and L3 so that the first line L1, the second line L2, and the third line L3, which are individually connected to the deformation units 120 and 130, operate individually, that is, fluid for applying the positive pressure flows in the first line L1 and/or the second line L2, and fluid for applying the negative pressure flows out of the third line L3, and each of the main lines L1, L2, and L3 may be provided with a valve to adjust the amount of fluid.

The main lines L1, L2, and L3 may be provided with a first fluid regulator, such as a compressor, an air injector, and/or a vacuum pump, and may be provided as a structure in which positive pressure and/or negative pressure is applied, but this is only an example, and the present disclosure is not limited thereto.

The auxiliary support unit 130 may be provided with a first dome 130A and a second dome 130B.

The first dome 130A may be disposed, for example, in an edge region of the first substrate W1, for example, as an edge or outside of the center part of the first substrate W1. The second dome 130B may be disposed, for example, adjacent to the edge region of the first substrate W1, and may be opposite to the edge of the first substrate W1, or located outside the edge of the first substrate W1.

In some embodiments, the positive pressure is provided to the first dome 130A, the negative pressure is provided to the second dome 130B, the first dome 130A is provided as a structure that presses the deformation plate 140 and the second dome 130B is provided as a structure that pulls the deformation plate 140, but this is only an example.

As another example, the first dome 130A and the second dome 130B may only differ in position and have the same shape and/or structure. That is, the positive pressure may be provided to each of the first dome 130A and the second dome 130B, or the negative pressure may be provided to each of the first dome 130A and the second dome 130B.

Alternatively, the positive pressure may be provided to each of the first dome 130A and the second dome 130B, and only the shape and position thereof may be different.

Various modified examples are possible such as an example in which the negative pressure may be provided to the first dome 130A and the positive pressure may be provided to the second dome 130B.

In addition, the scale-compensation amount of the first substrate W1 may be adjusted by adjusting the negative pressure and positive pressure in the auxiliary support unit 130, which will be explained referring to FIGS. 17 and 18.

And, as shown in FIG. 11, the second dome 130B and the deformation plate 140 may be provided as a structure that enables the vacuum sealing so that the negative pressure is provided to the second dome 130B, and the second dome 130B pulls the deformation plate 140.

For example, a first suction plate 140R having a hollow center is provided below the deformation plate 140, and the second dome 130B, the first chuck 110 or the second suction plate may be provided on the upper face of the second dome 130B to at least partially surround the first suction plate 140R. Also, an O-ring 130BR may be provided to seal between the first suction plate 140R and the second dome 130B, the first chuck 110 or the second suction plate the second suction plate.

However, this is only an example, and a vacuum sealing structure may be provided between the second dome 130B and the deformation plate 140, and the negative pressure may be formed only in the second dome 130B. Alternatively, various modified examples are possible, such as examples in which the negative pressure is formed in the second dome 130B and may be provided as a structure in which the support force of the deformation plate 140 is reduced in accordance with the shape that is concave downward.

In addition, the thickness of the upper face of the second dome 130B may be provided as a structure in which the thickness decreases toward the edge of the substrate W1 and the deformation rate changes in the same/similar manner that the thickness of the edge region 140S3 is thinner than the thickness of the center part 140S1 of the deformation plate 140 as described with reference to FIG. 9.

Figure 13:
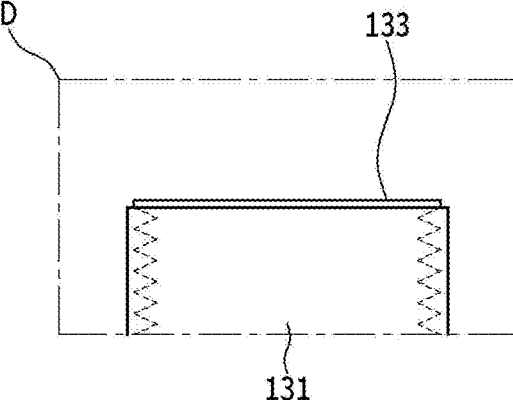
FIG. 13 is a diagram showing a status in which a second dome of FIG. 12 is contracted.

Referring to FIGS. 12 and 13, the second expander 133 of the first dome 130A may be reduced in volume, and may be stored to be at least partially folded in the hollow of the second base 131. That is, the second expander 133 may be stored in a partially folded form in the hollow of the second base 131 so that the second expander 133 does not expand excessively during expansion, for example, does not expand at 100% expansion capacity but expands at 90% expansion capacity, which may reduce damage caused by excessive expansion of the second expander 133 and may improve repetitive reliability, thereby increasing the number of process repetitions.

This may be applied to the first expander 123 of the main supporter 120 in the same/similar manner, and a part of the first expander 123 may be folded and stored on the first base 121.

According to a modified example, the first base 121 and the second base 131 are omitted, and each of the first expander 123 and the second expander 133 may be bonded to the first chuck 110. It is preferable that the thickness be at least 15 mm or more so that the first expander 123 and the second expander 133 are suitably fixed by a bonding manner.

Hereinafter, the provision of negative pressure and/or positive pressure of the auxiliary support unit 130 will be explained referring to the drawings.

However, before explaining the provision of negative pressure and/or positive pressure of the auxiliary support unit 130, the first substrate W1 will be explained first.

That is, in the embodiments of the present disclosure, the auxiliary support unit 130 of the deformation units 120 and 130 is provided to improve the yield of the chip (see FIG. 15, reference numeral is not shown), but before explaining the scale-compensation amount adjustment of the auxiliary support unit 130 to which the negative pressure/positive pressure is provided, the first substrate W1 for which the scale-compensation amount needs to be adjusted will be explained referring to the drawings.

Figure 14:
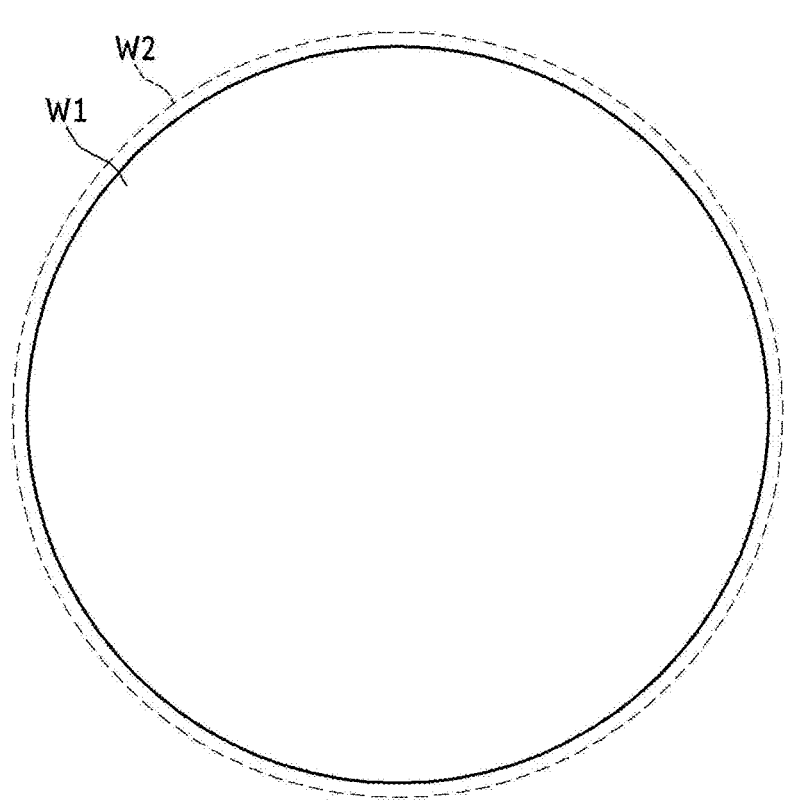
FIG. 14 is a diagram showing a ratio of the first substrate to the second substrate in a flat state.
Figure 15:
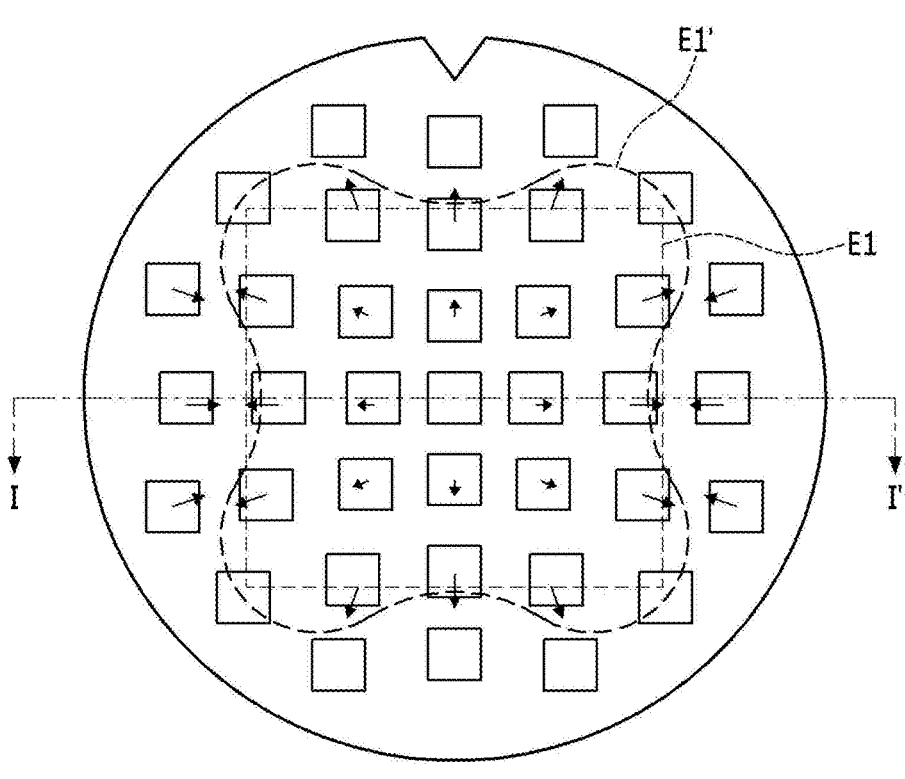
FIG. 15 is a plan view showing a status in which the first substrate becomes convex by a deformation plate.
Figure 16:
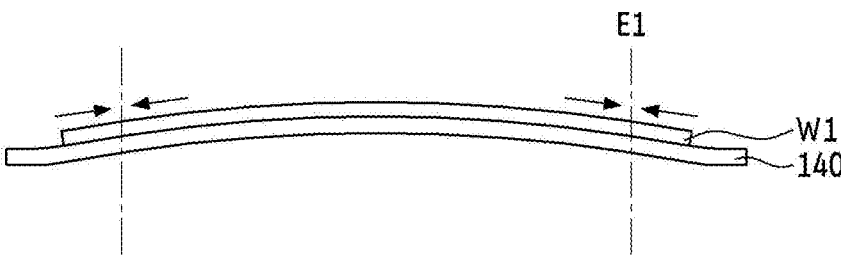
FIG. 16 is a diagram showing a cross section taken along line I-I' of FIG. 15.

FIG. 14 is a diagram showing the first substrate and the second substrate, FIG. 15 is a plan view showing the status in which the first substrate is made convex by the deformation plate, and FIG. 16 is a cross-sectional view taken along a cut line I-I' of FIG. 15.

First, referring to FIG. 14, the first substrate W1 provided in a flat plate shape is provided with a smaller diameter than the second substrate W2, in the course of being deformed into a convex hemispherical shape in synchronization with the shape deformation of the deformation plate 140, that is, in the course in which the first substrate W1 becomes convex upward, the area is expanded, and a scale-compensation amount may be provided to change to an area corresponding to the second substrate W2.

For example, the second substrate W2 may have a radius of 30 cm, and the first substrate W1 may be provided at a radius of 29.3 cm to 29.8 cm.

The chips of the first substrate W1 deformed into a convex shape may be bonded in a status corresponding to the chips of the second substrate W2.

However, the first substrate W1 deformed into a convex shape may have different degrees of expansion in the center part and edge region due to various factors such as the anisotropic characteristics of the wafer. At this time, the chips of the region which is excessively expanded or insufficiently expanded in the first substrate W1 (expanded in the opposite direction to the excessive expansion) may not correspond to the chips of the second substrate W2, which may degrade the product yield.

Referring to FIGS. 15 and 16, arrows indicate direction and magnitude of expansion of the first substrate W1.

With reference to the direction and magnitude of the arrows of FIG. 15, the center part of the first substrate W1 expands toward the edge region and the edge region expands toward the center, on the basis of the reference line E1 of the edge region. Further, excessive expansion occurs near the center part of the first substrate W1 adjacent to the reference line E1 of the edge region, and insufficient expansion occurs in the edge region.

When the excessive expansion and the insufficient expansion occur adjacent to the reference line E1 of the edge region of the first substrate W1, the product yield may decrease, and it is necessary to adjust the scale-compensation amount of the first substrate W1. In other words, it is necessary to compensate for insufficient expansion and excessive expansion adjacent to the reference line E1 of the edge region and improve the chip yield.

In order to improve the chip yield, in some embodiments, an auxiliary support unit 130 of the deformation units 120 and 130 is provided, and the auxiliary support unit 130 will be explained referring to the drawings.

Figure 17:
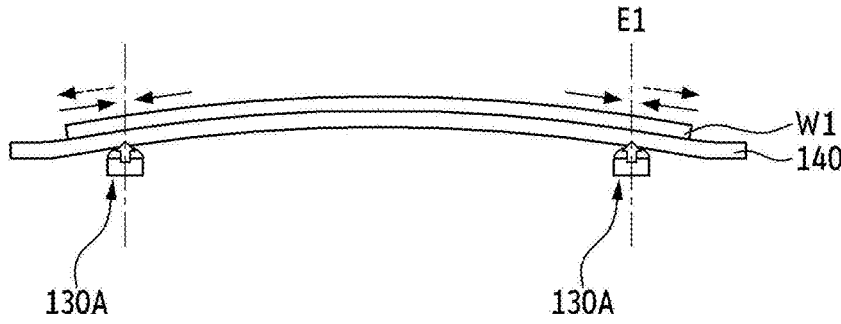
FIG. 17 is a diagram for explaining a first substrate whose scale-compensation amount is adjusted by a first dome of the substrate bonding apparatus according to some embodiments of the present disclosure.
Figure 18:
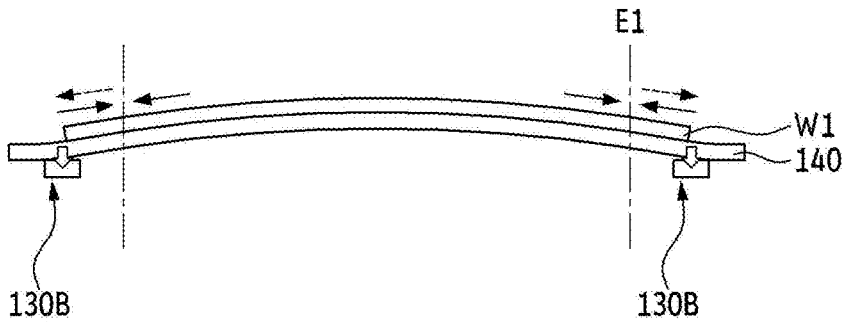
FIG. 18 is a diagram for explaining a first substrate whose scale-compensation amount is adjusted by a second dome of the substrate bonding apparatus according to some embodiments of the present disclosure.

FIG. 17 is a diagram for explaining a first substrate whose scale-compensation amount is adjusted by the first dome of the substrate bonding apparatus according to some embodiments of the present disclosure, and FIG. 18 is a diagram for explaining a first substrate whose scale-compensation amount is adjusted by a second dome of the substrate bonding apparatus according to some embodiments of the present disclosure.

Referring 17 and 18, the auxiliary support unit 130 may include a first dome 130A and/or a second dome 130B.

Hereinafter, an example is explained in which the first dome 130A provides the positive pressure and the second dome 130B provides the negative pressure, but as described above, this is only an example, and the first dome 130A may provide the negative pressure, and the second dome 130B may provide the positive pressure.

Alternatively, various modified examples are possible depending on the scale-compensation amount design, such as examples in which each of the first dome 130A and the second dome 130B may provide the positive pressure, or each of the first dome 130A and the second dome 130B may provide the negative pressure.

In FIGS. 17 and 18, solid arrows show the direction and magnitude of expansion of the first substrate W1, and dotted arrows show the force by which the scale-compensation amount is adjusted by the first dome 130A and/or the second dome 130B.

First, referring to FIG. 17, the positive pressure may be applied to the first dome 130A to press the deformation plate 140 in the upward direction. Since the pressurization of the first dome 130A generates a force that expands the first substrate W1 in the edge direction at the reference line E1 of the edge region, the expansion force which insufficiently expands in the edge region is offset, and the scale-compensation amount of the first substrate W1 may be adjusted.

Referring to FIG. 18, the negative pressure may be applied to the second dome 130B to pull the deformation plate 140 downward or to reduce the support force of the deformation plate 140. As the second dome 130B pulls the deformation plate 140 or the supporting force is reduced, a force in the opposite direction to the direction of insufficient expansion is provided to the edge region of the first substrate W1, and the scale-compensation amount of the first substrate W1 may be adjusted.

Hereinafter, other embodiments of the present disclosure will be explained referring to the drawings, and repeated explanations of the same configurations having the same functions may not be provided in the interest of brevity.

Briefly, according to some embodiments, the plurality of auxiliary support units 130 may be provided, like the first dome 130A and the second dome 130B, and the shape thereof may be provided variously. The auxiliary support unit 130 may have a ring shape with a penetrating center like the main supporter 120, may be provided as a polygonal shape, a butterfly shape, etc., or may be provided as a small protruding structure provided in a radius and/or radial direction on the main supporter 120. Various modified examples are possible such as an example in which the small protruding structure may be provided as a structure that moves in the radial direction. This will be explained referring to the drawings.

FIG. 19 is a plan view showing a lower module according to some embodiments of the present disclosure. In the interest of brevity and clarity, with reference to FIG. 19, differences from those explained referring to FIGS. 3 to 18 will be mainly described.

Referring to FIG. 19, the lower module 100 may include a first chuck 110, a deformation plate 140, deformation units 120 and 130, and a clamp unit 170, in the same or similar manner as described above.

The deformation units 120 and 130 according to some embodiments may include a first dome 130A and a second dome 130B, the first dome 130A has a ring shape and the second dome 130B is provided as a plurality of compact structures having a smaller diameter than the main supporter 120, and may be provided in a large number along the periphery of the main supporter 120 and the first dome 130A outside the main supporter 120 and the first dome 130A. That is, a plurality of second domes 130B may be provided along a virtual circle (e.g., circumferentially spaced apart from one another).

As mentioned above, other embodiments are possible by combining any one or more of the example embodiments and known techniques. It goes without saying that various modified examples are possible, such as examples in which the first dome 130A and the second dome 130B are provided with positive pressure to press the deformation plate 140, the positive pressure is provided to the first dome 130A to press the deformation plate 140, and the negative pressure is provided to the second dome 130B to pull the deformation plate 140.

A reference numeral "LP" shows a lift pin hole in which the lift pin 150 shown in FIG. 8 is provided or received.

Figure 20:
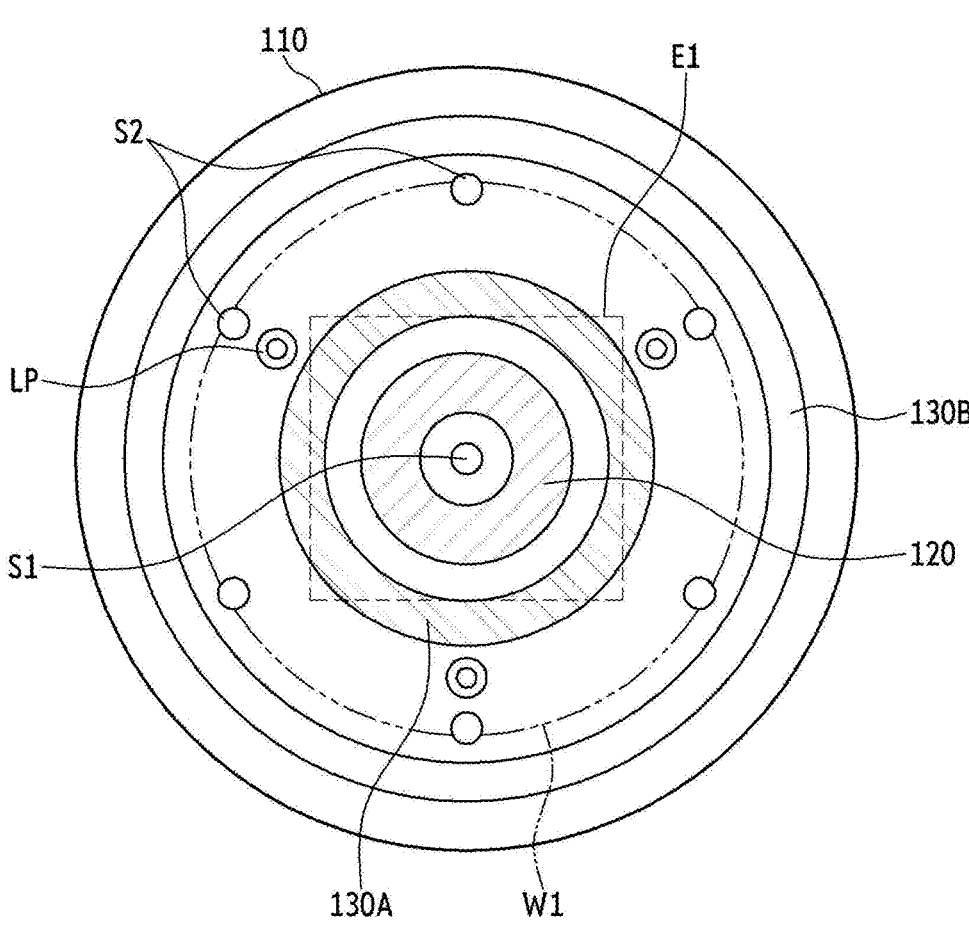
FIG. 20 is a plan view showing a lower module according to some embodiments of the present disclosure.

FIG. 20 is a plan view showing a lower module according to some embodiments of the present disclosure. In the interest of brevity and clarity, with reference, differences from those explained referring to FIGS. 3 to 19 will be mainly explained with reference to FIG. 20.

Referring to FIG. 20, the lower module 100 may include a first chuck 110, a deformation plate 140, a deformation unit 120 and 130, and a clamp unit 170, in the same or similar manner as described above.

In the deformation units 120 and 130 according to some embodiments, unlike the case where the second dome 130B is provided as a small protruding structure, the second dome 130B has a structure with a penetrating center similarly to the first dome 130A, and may have a (continuous) ring shape as an example.

The deformation units 120 and 130 may be provided in various modified examples in which the positive pressure is provided to each of the first dome 130A and the second dome 130B to press the deformation plate 140, or the positive pressure is provided to the first dome 130A to press the deformation plate 140, and the negative pressure is provided to the second dome 130B to pull the deformation plate 140, as in the third embodiment.

Figure 21:
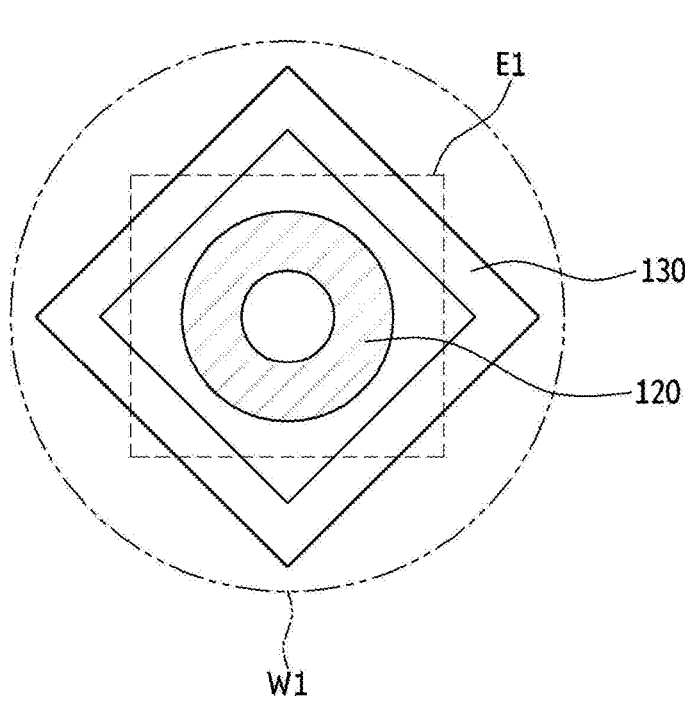
FIG. 21 is a plan view showing a lower module according to some embodiments of the present disclosure.
Figure 22:
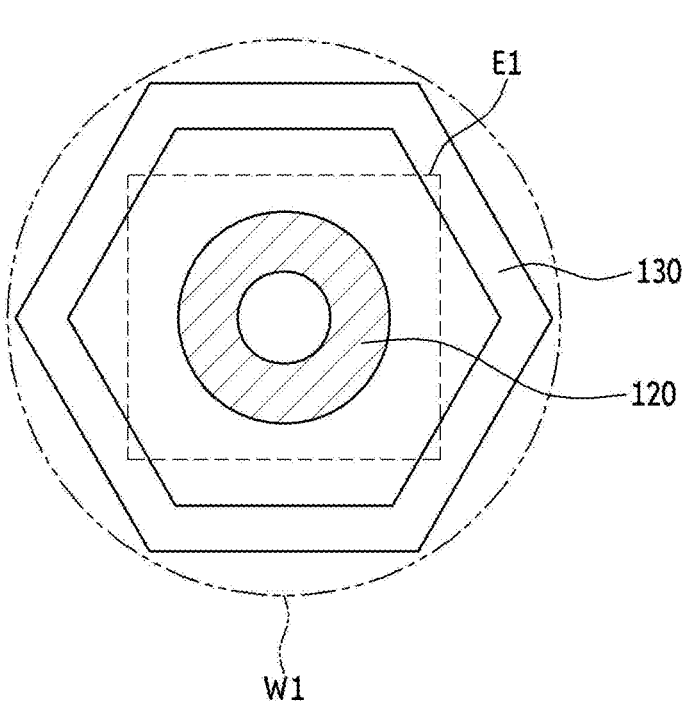
FIG. 22 is a plan view showing a lower module according to some embodiments of the present disclosure.
Figure 23:
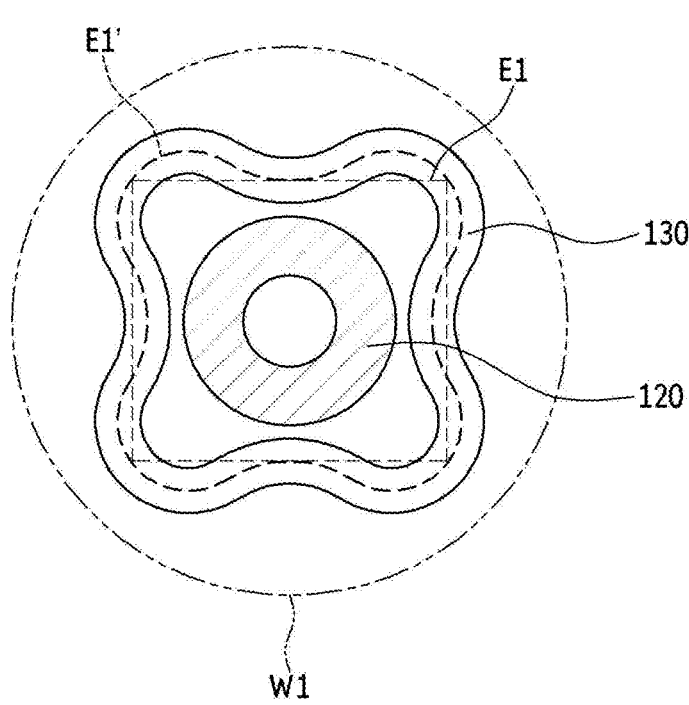
FIG. 23 is a plan view showing a lower module according to some embodiments of the present disclosure.

FIG. 21 is a plan view showing a lower module according to some embodiments of the present disclosure, FIG. 22 is a plan view showing a lower module according to some embodiments of the present disclosure, and FIG. 23 is a plan view showing a lower module according to some embodiments of the present disclosure.

In the interest of brevity and clarity, differences from those explained referring to FIGS. 3 to 20 will be mainly described referring to FIGS. 21 to 23.

Referring to FIGS. 21 to 23, the lower module 100 according to some embodiments may include a first chuck 110, a deformation plate 140, deformation units 120 and 130, and a clamp unit 170, in the same or similar manner as described above.

First, as shown in FIG. 21, in the deformation units 120 and 130, the auxiliary support unit 130 may be provided as a rhombic shape with a penetrating center, instead of a ring shape.

In addition, the auxiliary support unit 130 can be provided in various modified examples, and the auxiliary support unit 130 is not limited to being provided in a single unit, and may of course be provided in plurality of units in the radial direction, as shown in the drawings. Although it is not shown in the drawings, various modified examples are possible, such as examples in which the ring-shaped first dome 130A may be provided and the second dome 130B may be provided in a rhombic shape.

The auxiliary support portion 130 is not limited to a rhombic shape, and may be provided in a polygonal shape such as a rectangle or a square with a penetrating center.

That is, in the deformation units 120 and 130, as shown in FIG. 22, the auxiliary support portion 130 may be provided in a hexagonal shape. Alternatively, the shape of the auxiliary support portion 130 may be provided in a pentagonal or octagonal shape with a penetrating center.

In yet another example, in the deformation units 120 and 130, as shown in FIG. 23, the auxiliary support portion 130 may be provided in a butterfly shape with a penetrating center. This is provided so that the reference line E1 of the edge region is formed as a reference line E1' of the deformed edge region as shown in FIG. 15, and corresponds to the first substrate W1 whose edge region is deformed like a butterfly shape.

Although the auxiliary support unit 130 of the above-mentioned embodiments may be in a status of a fixed position, the auxiliary support unit 130 is not limited to being fixed in position. This will be explained referring to the drawings.

Figure 24:
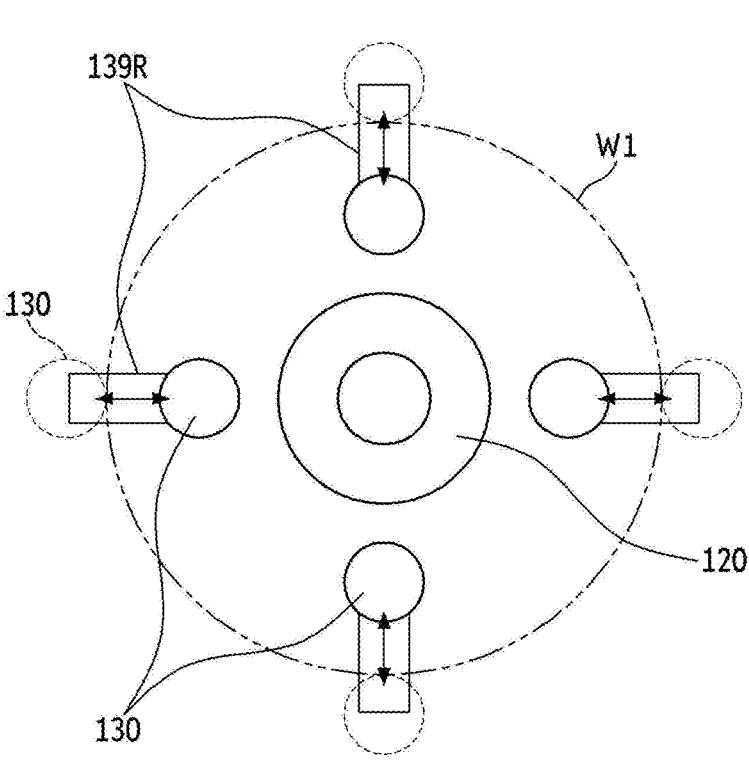
FIG. 24 is a plan view showing a lower module according to some embodiments of the present disclosure.

FIG. 24 is a plan view showing a lower module according to some embodiments of the present disclosure. In the interest of brevity and clarity, differences from those explained referring to FIGS. 3 to 23 will be mainly described with reference to FIG. 24.

Referring to FIG. 24, the lower module 100 may include a first chuck 110, a deformation plate 140, deformation units 120 and 130, and a clamp unit 170, in the same or similar manner as described above.

In addition, in the deformation units 120 and 130, the auxiliary support unit 130 is not provided in a ring shape, but a plurality of auxiliary support units may be provided as a structure protruding along a virtual circle (e.g., circumferentially spaced apart from one another), and may be provided to be movable in a radial direction.

For example, the first chuck 110 may be provided with a rail 139R having a length formed in the radial direction on the upper face of the first chuck 110. The rail 139R may be provided as a linear motion (LM) guider, and may guide the movement direction of the auxiliary support unit 130.

The auxiliary support unit 130 may move along the rail 139R. For example, an LM block connected to the LM guider may be provided to be movable by driving a linear motor.

In some embodiments, the rail 139R is shown as having a length formed or extending in the radial direction, but is not limited thereto. Various modified examples are possible such as an example in which the length is formed in the radial direction or in the diagonal direction, and the movement direction of the auxiliary support unit 130 may be guided in the radial direction or in the diagonal direction.

As mentioned above, the embodiments mentioned in the present disclosure may be combined with each other to provide other modified examples. For example, various modified examples are possible such as an example in which the auxiliary support unit 130 of the one example embodiment is combined with the auxiliary support unit 130 of another example embodiment, the auxiliary support unit 130 may be provided to be partially movably provided along the rail 139R, while being provided in a ring shape with the penetrating center, and may be provided in a structure in which a shape is changed from a circle to a butterfly shape or a polygonal shape.

Furthermore, the deformation units 120 and 130 are not limited to a dome and/or closed curve (ring, butterfly, etc.) structure, but other modified examples are possible, which will be explained referring to FIG. 25.

FIG. 25 is a plan view showing a lower module according to some embodiments of the present disclosure. In the interest of brevity and clarity, differences from those explained referring to FIGS. 3 to 24 will be mainly described referring to FIG. 25.

Referring to FIG. 25, the lower module 100 according to some embodiments may include a first chuck 110, a deformation plate 140, deformation units 120 and 130, and a clamp unit 170, in the same or similar manner as described above.

Although the auxiliary support unit 130 of the above-mentioned embodiments are explained as being formed as a closed curve or a small dome, the auxiliary support unit 130 may also have a bar shape that protrudes outward in accordance with a region that sinks below the surroundings to correspond to the saddle-shaped first substrate W1.

For example, referring to FIG. 25, when the upper and lower parts are excessively expanded compared to the left and right in the edge region of the first substrate W1, the auxiliary support unit 130 may be provided in a bar shape having a length formed in the vertical direction to adjust the scale-compensation amount in the excessive expansion direction on the left and right in the edge region of the first substrate W1, and may be provided to provide positive pressure.

Alternatively, various modified examples are possible, such as examples in which the auxiliary support unit 130 is provided in a bar shape having a length formed in the horizontal direction while providing a negative pressure, and may be provided at the upper and lower parts in the edge region of the first substrate W1.

Hereinafter, the upper module 200 will be explained referring to the drawings.

Figure 26:
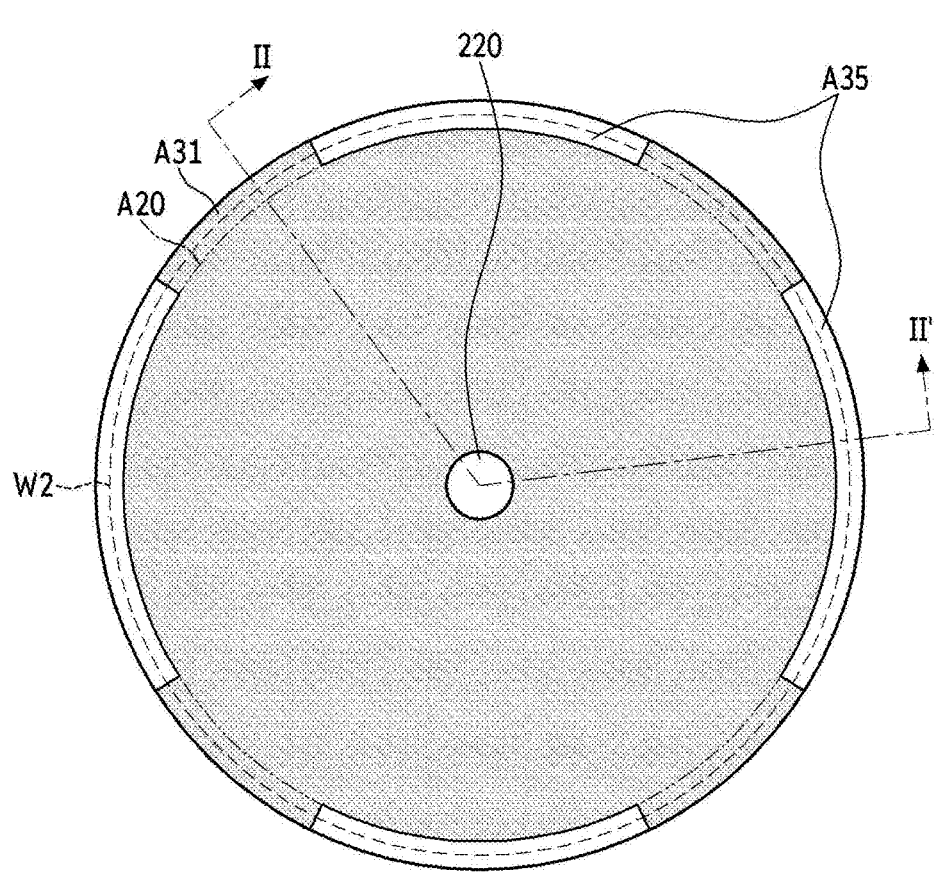
FIG. 26 is a plan view showing the upper module according to some embodiments of the present disclosure.
Figure 27:
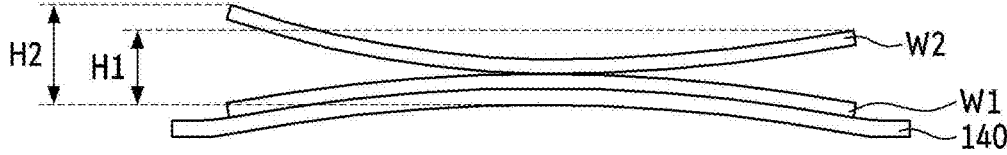
FIG. 27 is a view showing a second substrate corresponding to a cut face II-II' of FIG. 26.

FIG. 26 is a plan view showing an upper module according to some embodiments of the present disclosure, and FIG. 27 is a diagram showing a second substrate corresponding to a cut face II-II' of FIG. 26.

Referring to FIGS. 26 and 27, according to some embodiments, the second chuck 210 of the upper module 200 does not vacuum-adsorb the entire face of the second substrate W2, but may be in a status which vacuum-adsorbs a partial region and releases vacuum suction in the remaining portion for adjusting the scale-compensation amount.

For example, in the first substrate W1 (see FIG. 15), an insufficient expansion phenomenon may occur in a specific region adjacent to the reference line E1 of the edge region than in other regions. That is, the reference line E1 of the edge region may be deformed to form a reference line E1' of the edge region as shown in FIG. 15 as an example, and the edge region may be deformed into a butterfly shape.

When the second substrate W2 is bonded to the first substrate W1, the edge of the second substrate W2 of the first region A31 opposite to the insufficient expansion region of the first substrate W1 may be vacuum adsorbed, and the edge of the second substrate W2 of the second region A35 opposite to the region that does not form the insufficient expansion region may not be vacuum-adsorbed, so that a scale-compensation amount is provided in accordance with the first substrate W1 whose edge region is deformed into a butterfly shape.

As a result, when the edge of the second substrate W2 falls onto the first substrate W1, the edge of the second substrate W2 of the first region A31 falls later than the edge of the second substrate W2 of the second region A35. The edge of the second substrate W2 of the first region A31 has a second height H2, and the edge of the second substrate W2 of the second region A35 has a first height H1. Accordingly, a height difference occurs between the edges of the second substrate W2 in the first region A31 and the second region A35, and the scale-compensation amount may be adjusted by factors such as gravitational acceleration, accordingly.

However, this is merely an example, and the second chuck 210 may vacuum-adsorb the entire face of the second substrate W2. Alternatively, various modified examples are possible such as an example in which the second chuck 210 may vacuum-adsorb only the edge of the second substrate W2, but does not vacuum-adsorb the edge inner region A20 of the second substrate W2.

In addition, the illustrated embodiment explains an example in which the first upper region A31 and the second upper region A35 are alternately provided along the edge of the second substrate W2, but the present disclosure is not limited thereto, and the size and position of the regions are not limited to the example of the drawing.

Hereinafter, still other modified example will be explained referring to the drawings.

Figure 28:
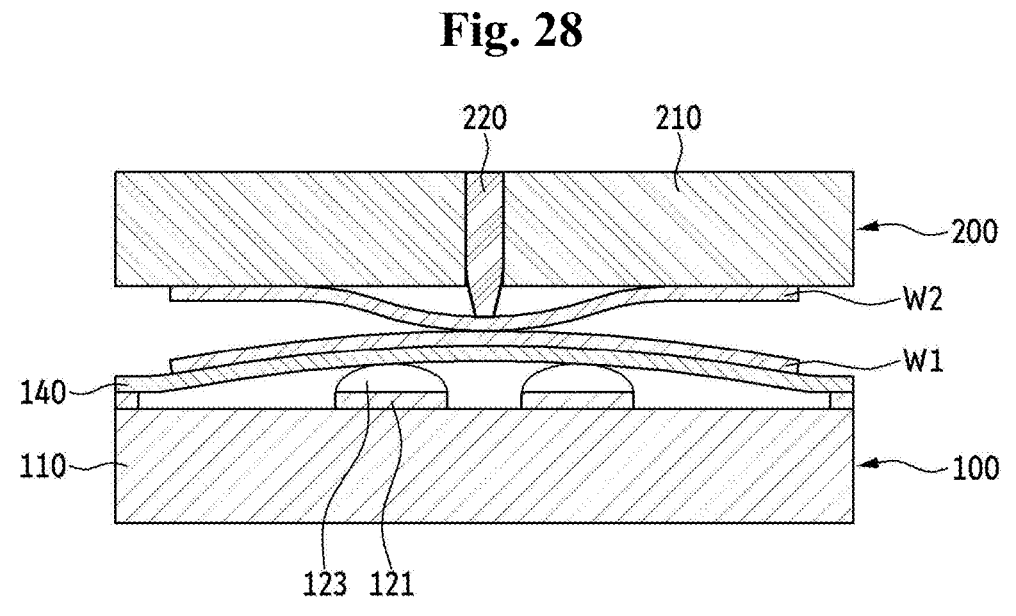

FIG. 28 is a diagram showing a lower module according to some embodiments of the present disclosure.

Referring to FIG. 28, the lower module 100 may include a first chuck 110 and a deformation plate 140 in the same or similar manner as described above.

On the other hand, the auxiliary support unit 130 may be omitted in the lower module 100. Therefore, the shape of the deformation plate 140 may be deformed due to the pressurization due to the main supporter 120 without the operation of the auxiliary support unit 130.

However, since the present disclosure may be further embodied by combining at least one of the example embodiments and the known techniques, in the lower module 100, the deformation plate 140 may be deformed by the main supporter 120 with the auxiliary support unit 130 omitted, the fluid is discharged from the auxiliary line L4 of the second embodiment, and the deformation of the deformation plate 140 due to the vacuum atmosphere may be induced.

In other words, the auxiliary support unit 130 may be omitted, and the shape of the deformation plate 140 may be deformed by the main supporter 120, the auxiliary line L4, and the second fluid regulator.

The substrate bonding apparatus according embodiments may improve the accuracy limit and precisely adjust the alignment accuracy to improve the chip yield.

Although example embodiments of the present disclosure have been described above with reference to the accompanying drawings, the present disclosure is not limited to the above embodiments, and may be embodied in other specific forms without changing the technical spirit or essential features of the present disclosure. Accordingly, the above-described embodiments should be understood in all respects as illustrative and not restrictive.

What is claimed is:

1. A substrate bonding apparatus comprising:
a first chuck having a diameter larger than that of a first substrate;
a deformation plate configured to support the first substrate, and is configured to have a variable shape on the first chuck; and
a deformation unit between the first chuck and the deformation plate,
wherein the deformation unit includes a main supporter that is deformable to press the deformation plate, the main supporter having a closed curve shape with a penetrating center, and
wherein the deformation unit further comprises an auxiliary support unit outside the main supporter, and whose height is adjustable, or whose volume is changeable by inflow and outflow of fluid.

2. The substrate bonding apparatus of claim 1, further comprising:
a clamp unit configured to restrain the deformation plate to prevent the deformation plate from being detached from the first chuck,
wherein the clamp unit comprises:
a first ring provided on an opposite side of the deformation plate on the first chuck;
a second ring provided on the opposite side of the deformation plate on the first chuck; and
a coupler coupled to the first ring and the second ring.

3. The substrate bonding apparatus of claim 2,
wherein the coupler comprises a bolt that penetrates the deformation plate without being bolted to the deformation plate, and is screwed into at least one of the first ring or the second ring.

4. The substrate bonding apparatus of claim 1,
wherein the first chuck includes a rib unit configured to support the deformation plate, and the rib unit includes a cylindrical first rib with an open top at a center part of and inside the main supporter.

5. The substrate bonding apparatus of claim 4,
wherein the rib unit further includes a second rib outside the main supporter, and the second rib includes:
a lower rib on the first chuck; and
an upper rib on the deformation plate and the lower rib, and having a larger diameter than the lower rib.

6. The substrate bonding apparatus of claim 1,
wherein the first chuck includes a sensor unit configured to detect a height of the deformation plate, and
the sensor unit includes:
a first sensor at a center part of the main supporter;
a first target at the center part of the deformation plate to provide a sensing face of the first sensor;
a second sensor at a position opposite to an edge of the first substrate and outside the main supporter; and
a second target on the deformation plate to provide a sensing face of the second sensor.

7. The substrate bonding apparatus of claim 1, further comprising:

a second fluid regulator configured to apply a negative pressure to a space between the first chuck and the deformation plate, which is an external space of the deformation unit.

8. The substrate bonding apparatus of claim 1, wherein the auxiliary support unit includes a first dome located at an edge region of the first substrate.

9. The substrate bonding apparatus of claim 8, wherein the auxiliary support unit includes a second dome which is opposite to an edge of the first substrate, or located outside the edge of the first substrate.

10. The substrate bonding apparatus of claim 1, wherein the auxiliary support unit is configured to press the deformation plate in an upward direction in response to a positive pressure being provided to the auxiliary support unit, or the auxiliary support unit is configured to pull the deformation plate in a downward direction or to reduce a support force for supporting the deformation plate in response to a negative pressure being provided to the auxiliary support unit.

11. The substrate bonding apparatus of claim 1, wherein the main supporter is configured to be variable in volume due to inflow and outflow of fluid.

12. The substrate bonding apparatus of claim 11, wherein the main supporter includes a first expander whose volume is expanded or contracted.

13. The substrate bonding apparatus of claim 12, wherein the main supporter further includes a first base on the first chuck and having a hollow formed therein, and when the first expander is supplied with fluid from a first fluid regulator, an upper end extending from an upper part of the first base by volume expansion presses the deformation plate, and when the fluid is recovered by the first fluid regulator or the fluid is discharged to the outside, the first expander is at least partially folded and stored in the hollow of the first base due to a reduction in volume.

14. The substrate bonding apparatus of claim 1, wherein the deformation plate has a thickness at an edge region that is thinner than a thickness of a center part or a middle region.

15. The substrate bonding apparatus of claim 14, wherein a face of the deformation plate facing the first chuck comprises an inclined face that is at least partially inclined relative to horizontal in the edge region, and the deformation plate has a step formed between the center part and the edge region.

16. The substrate bonding apparatus of claim 14, wherein the deformation plate has different thicknesses from each other in regions that are partitioned in a circumferential direction.

17. The substrate bonding apparatus of claim 1, further comprising:

a second chuck configured to support a second substrate opposite to the first substrate.

18. A substrate bonding apparatus, comprising:

a first chuck having a diameter larger than that of a first substrate;

a deformation plate configured to support the first substrate, and is configured to have a variable shape on the first chuck;

a second chuck configured to support a second substrate opposite to the first substrate;

a deformation unit between the first chuck and the deformation plate, wherein the deformation unit includes a main supporter that is deformable to press the deformation plate, the main supporter having a closed curve shape with a penetrating center, and wherein the second chuck comprises a first region and a second region alternately along an edge of the second substrate, and the second chuck vacuum-adsorbs the second substrate in the first region, and does not vacuum-adsorb the second substrate in the second region.

19. A substrate bonding apparatus comprising:

a lower module comprising a first chuck having a diameter larger than that of a first substrate; and an upper module comprising a second chuck configured to support a second substrate opposite to the first substrate, wherein the lower module includes:

a deformation plate configured to support the first substrate, the deformation plate above the first chuck and configured to have a variable shape, a thickness of an edge region of the deformation plate being thinner than a thickness of a center part or a middle region of the deformation plate, and a lower face of the edge region comprising an inclined face that is inclined upward relative to horizontal;

a deformation unit between the first chuck and the deformation plate;

a clamp unit configured to restrain the deformation plate to prevent the deformation plate from being detached from the first chuck;

a cylindrical first rib with an open top at the center part of the deformation unit;

a first sensor at the center part of the deformation unit and the first rib; and a first target at the center part on the lower face of the deformation plate and defining a sensing face of the first sensor, wherein the deformation unit includes:

a main supporter having a ring shape and having an expandable volume in response to fluid supplied from a first fluid regulator to press the deformation plate; and an auxiliary support unit positioned outside the main supporter, the auxiliary support unit having a volume that is variable due to inflow and outflow of fluid supplied from a compressor, which presses the deformation plate in an upward direction by provision of a positive pressure, or which pulls the deformation plate in a downward direction by provision of a negative pressure by a vacuum pump, wherein the clamp unit includes:

a first ring below the first chuck;

a second ring above the deformation plate; and a bolt which is coupled to the first ring and the second ring, and passes through the deformation plate and the first chuck without being bolted to the deformation plate and the first chuck.

* * * * *